United States Patent [19]
Lillis et al.

[11] 4,381,497
[45] Apr. 26, 1983

[54] DIGITAL-TO-ANALOG CONVERTER HAVING OPEN-LOOP VOLTAGE REFERENCE FOR REGULATING BIT SWITCH CURRENTS

[75] Inventors: William J. Lillis; Jimmy R. Naylor; Anthony D. Wang; Robert L. White, all of Tucson, Ariz.

[73] Assignee: Burr-Brown Research Corporation, Tucson, Ariz.

[21] Appl. No.: 250,858

[22] Filed: Apr. 3, 1981

[51] Int. Cl.³ ............................................. H03K 13/05
[52] U.S. Cl. ............................. 340/347 DA; 323/315; 340/347 M
[58] Field of Search .... 340/347 M, 347 DA, 347 CC; 307/296, 297; 323/303, 312–315, 231

[56] References Cited
U.S. PATENT DOCUMENTS 3,961,326  6/1976  Craven .................. 340/347 DA
4,093,907  6/1978  Nutz ........................ 323/315 X

*Primary Examiner*—T. J. Sloyan
*Attorney, Agent, or Firm*—Cahill, Sutton & Thomas

[57] ABSTRACT

An open-loop voltage reference circuit, adapted to regulate a plurality of bit switch currents within a digital-to-analog converter, includes a zener diode reference leg for developing a reference voltage. The reference leg also includes a base-emitter junction voltage multiplier for creating a compensating voltage having a temperature tracking coefficient that is equal and opposite to that of the zener diode junction voltage. The reference voltage developed by the reference leg is used to bias a temperature independent current within a slave leg, and a current mirror circuit mirrors the current within the slave leg for supplying a constant current to the reference leg. The magnitude of the reference voltage is reduced through a divider leg, and an emitter follower leg provides a low impedance bias voltage for driving the plurality of bit switch current sources. The open-loop voltage reference circuit is further adapted to compensate for second order errors caused by temperature induced variations in current gain and Early effect variations related to changes in the power supply voltage. A Gain Adjust feature is also provided for adjusting the bit switch currents without adversely affecting the regulation thereof.

25 Claims, 6 Drawing Figures

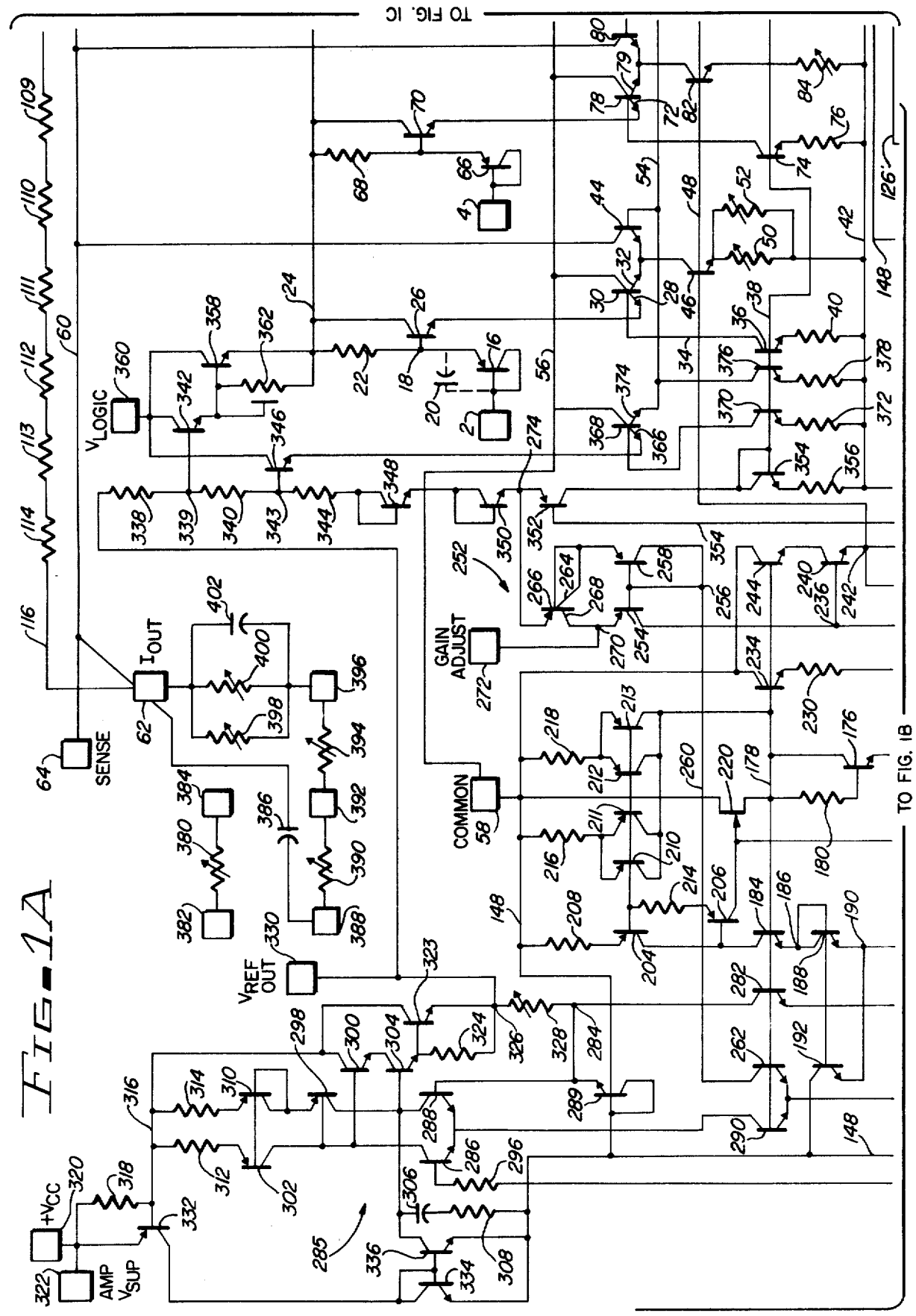

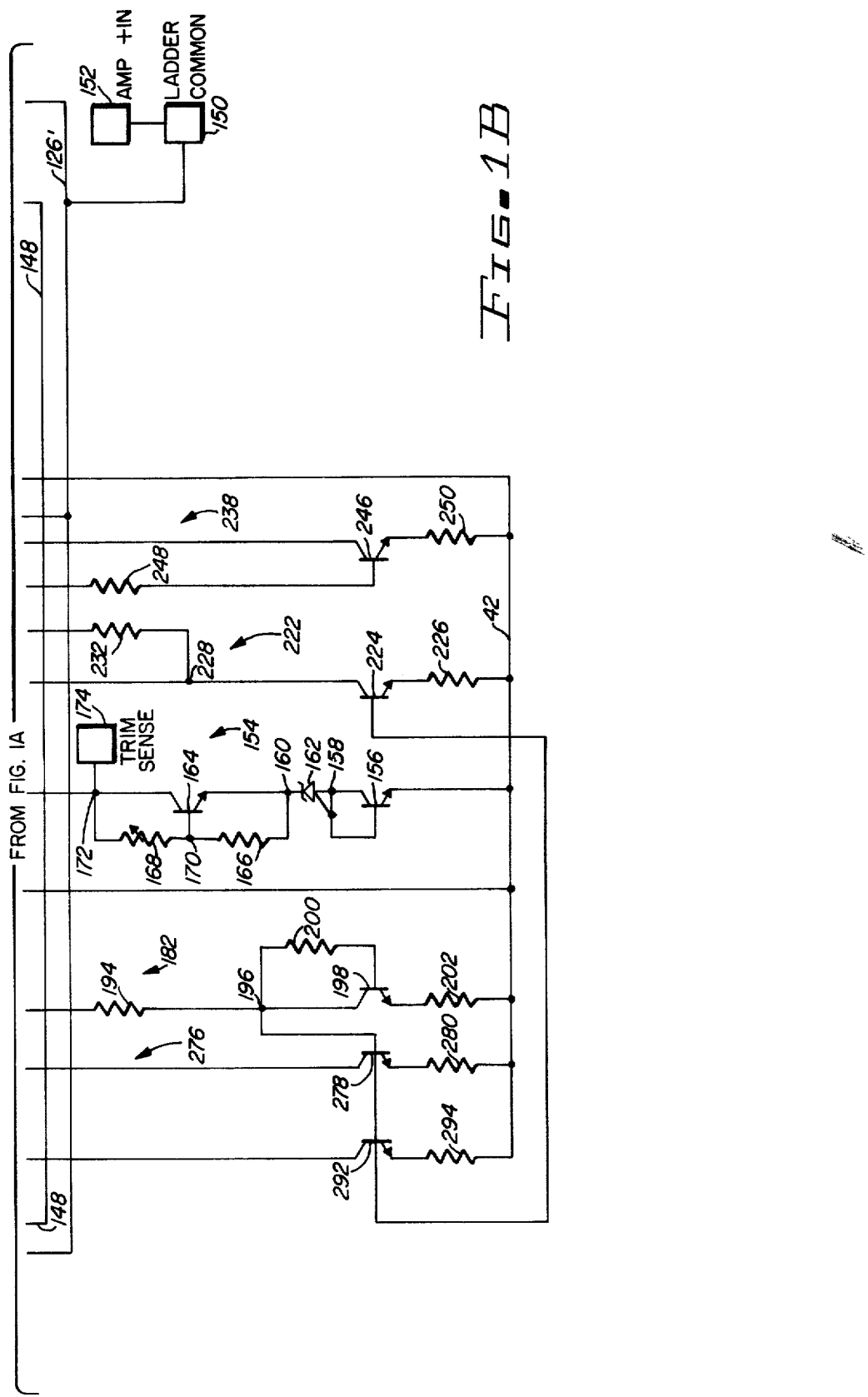

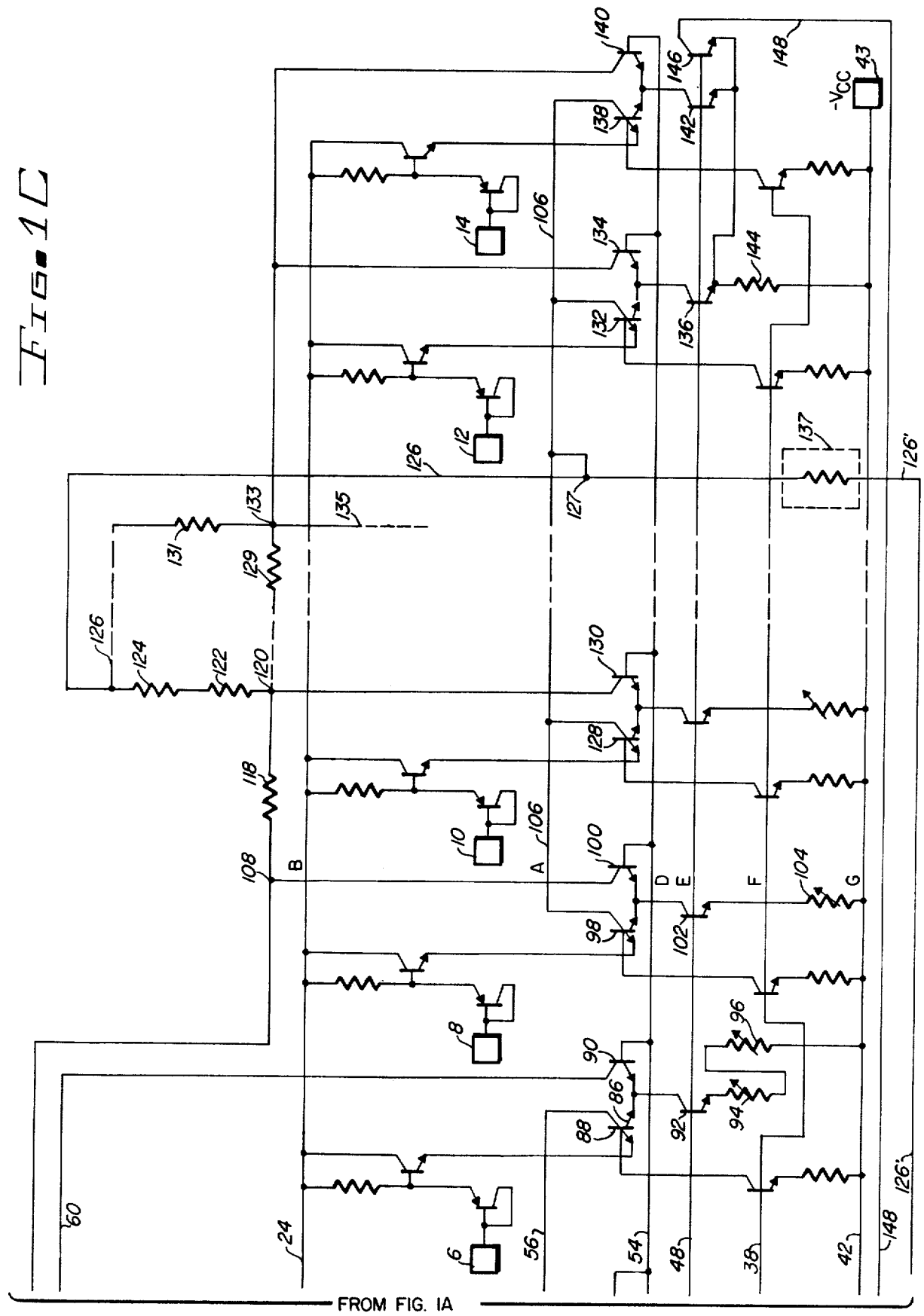

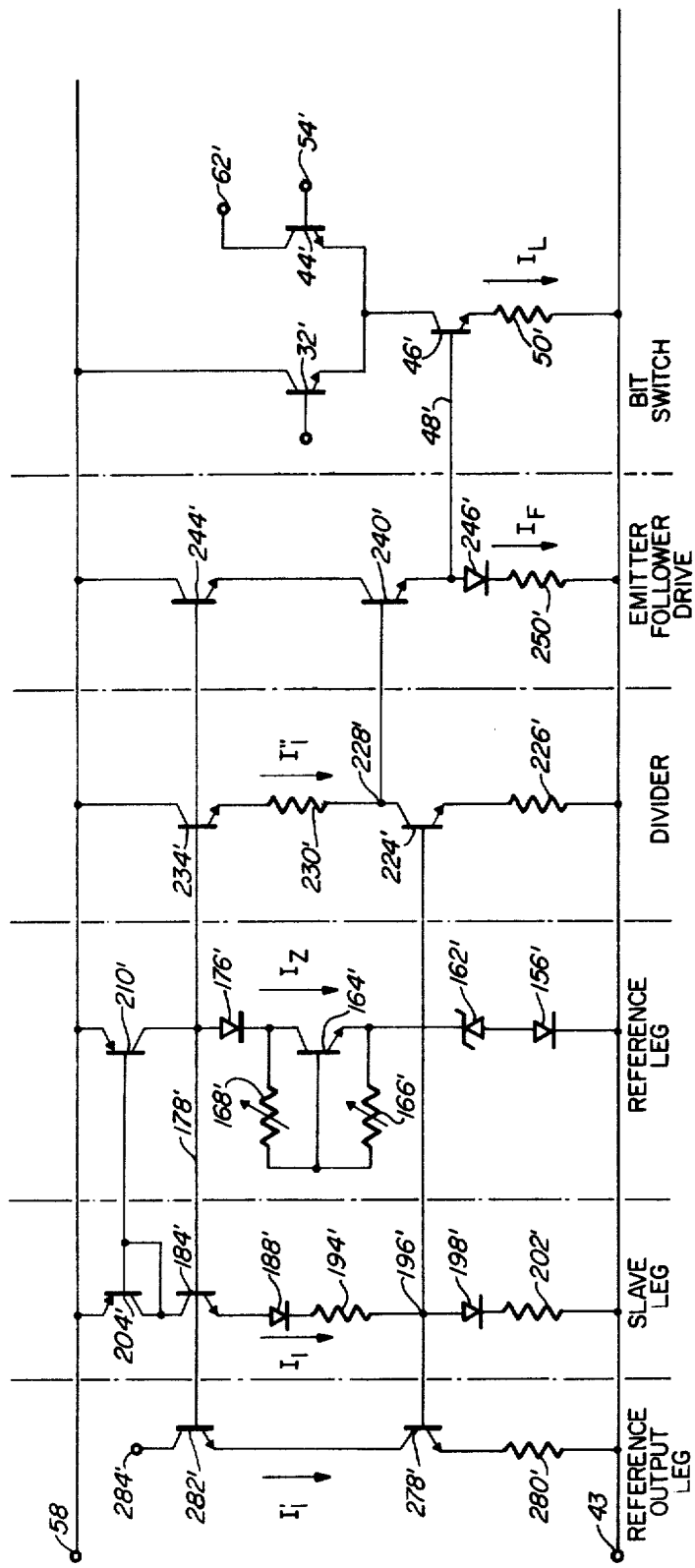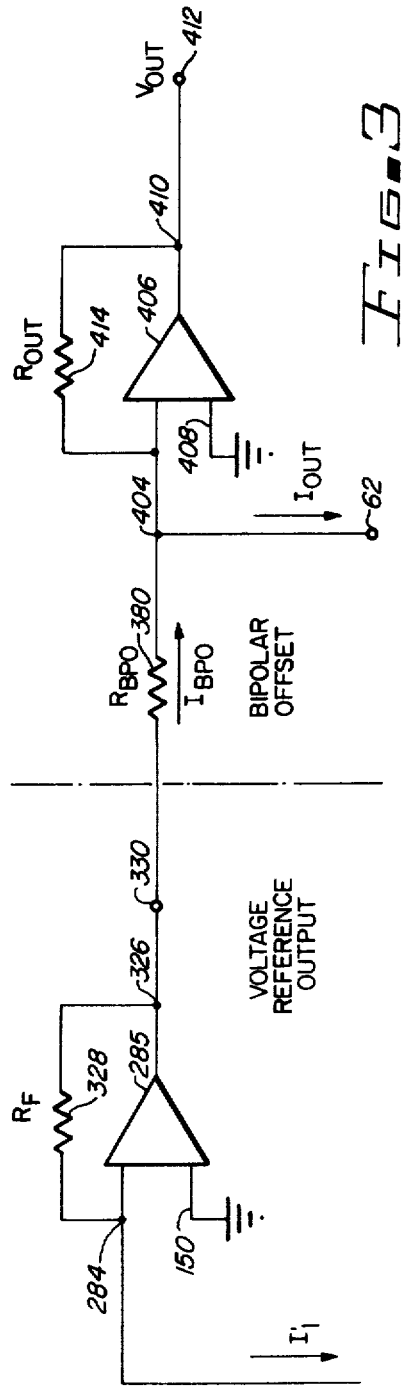

DIGITAL-TO-ANALOG CONVERTER HAVING OPEN-LOOP VOLTAGE REFERENCE FOR REGULATING BIT SWITCH CURRENTS

CROSS-REFERENCE TO RELATED APPLICATIONS

1. "Digital-To-Analog Converter Providing Voltage Reference Output for Bipolar Offset," Ser. No. 250,869, filed on even date herewith, invented by Smith et al., and assigned to the assignee of the present invention.

2. "Digital-To-Analog Converter Having Single-Ended Input Interface Dircuit," Ser. No. 250,868, filed on even date herewith, invented by Naylor et al, and assigned to the assignee of the present invention.

3. "Digital-To-Analog Converter Having Ladder Network And Improved Interconnection Therefor," Ser. No. 250,867, fled on even date herewith, invented by Wang et al., and assigned to the assignee of the present invention.

BACKGROUND OF THE INVENTION

1. Field of the Invention

The present invention relates generally to digital-to-analog converter circuits, and more particularly, to reference circuits used therein for regulating the bit switch currents that are controlled by the digital input for generating the analog output.

2. Description of the Prior Art

Monolithic digital-to-analog converter circuits are well known in the art and typically include a plurality of bit switches each responsive to a particular bit within the input digital word for selectively steering an associated bit switch current to a summing node at which an analog output current is provided. The current contributed to the analog output current by each of the plurality of bit switches is scaled in a binary weighted fashion in accordance with the binary weighting of the particular bit to which each bit switch is responsive.

When implementing such a monolithic digital-to-analog converter circuit, it is desirable to regulate the bit switch currents in order to maintain them constant regardless of changes in temperature or power supply voltage. One such method of regulation commonly practiced in the art is to form a closed or servo loop regulation network employing feedback whereby an amplifier is provided within the integrated circuit for generating the bias voltage used to bias the bit switch current sources. A reference current source, similar to those current sources used to provide the bit switch currents, is also biased by the output of the amplifier, and the current conducted by the reference current source is fed back to an inverting input of the amplifier. The non-inverting input of the amplifier is coupled to a fixed voltage, such as ground potential. A resistor is coupled between the inverting input of the amplifier and a known reference voltage whereby the current conducted by the reference current source creates a voltage drop across the resistor. The amplifier regulates the bias voltage in order to maintain the voltage at its inverting input equal to the fixed voltage at its non-inverting input. Accordingly, any variations in the bias voltage or in the characteristics of the current source transistors which cause a change in the bit switch currents similarly causes a change in the current conducted by the reference current source which, in turn, causes the amplifier to readjust the bias voltage until the current conducted by the reference current source returns to its original value.

Although such closed loop regulation circuits provide excellent compensation for errors which would otherwise be induced by changes in temperature or power supply voltage, the bandwidth of the closed loop amplifier is typically only one megahertz or less. If a high frequency (i.e., higher than the bandwidth of the closed-loop amplifier) is imposed upon the bias voltage, the closed-loop amplifier can not immediately respond thereto. Thus, the bias voltage becomes somewhat unstable and causes similar transients to appear within all of the bit switch currents which it biases. Accordingly, monolithic digital-to-analog converter circuits which utilize closed-loop regulation circuits are typically restricted to relatively slow analog output settling times (i.e., on the order of one hundred to three hundred nano-seconds). To prevent transients from being coupled onto the bias voltage conductor, input networks used to interface with the digital input signal are purposely designed to slow the input pulses received thereby in order to prevent high frequency transients from being coupled to the bias voltage conductor. Such techniques have been successful in preventing instability of the bias voltage, but only at the cost of increased settling time of the analog output.

Digital-to-analog converter circuits are also known in the prior art wherein an open-loop reference circuit is utilized to generate a voltage for biasing the bit switch current sources. Typically, such open-loop voltage reference circuits utilize a zener diode as a component thereof. However, such open-loop reference circuits have failed in the past to match the regulation obtained by the above described closed-loop reference circuits. It has also been known in the art to form a temperature compensated reference voltage, via a zener diode coupled in series with a base-emitter junction voltage multiplier, and providing the resultant temperature compensated voltage at one input of a differential amplifier, the output of which is used to regulate the current flowing through the zener diode. Such a circuit is used within the digital-to-analog converter portion of an analog-to-digital converter circuit commercially available from Analog Devices, Inc. of Norwood, Mass. under the designation AD 571, and described by Brokaw, "A Monolithic 10-Bit A/D Using I$^2$L and LWT Thin-Film Resistors", IEEE Journal of Solid State Circuits, December 1978, Vol. SC-13, No. 6, pp. 736–745. However, the differential amplifier used within such a reference circuit is not isolated from such transients as may be imposed upon the bias voltage conductor and is relatively sensitive to such transients; accordingly, the settling time of the digital-to-analog converter circuit is necessarily increased thereby.

In truly open-loop reference circuits used within prior art digital-to-analog converters, optimum regulation of the reference voltage developed by such a circuit is achieved only when the reference voltage is at a particular magnitude. Should it be desired to vary the magnitude of of the reference voltage in order to adjust the magnitudes of the bit switch currents, the temperature compensation scheme is no longer optimized. Yet, it is often desirable to adjust the magnitudes of the bit switch currents in order to adjust the full scale analog output current provided by the digital-to-analog converter circuit.

Accordingly, it is an object of the present invention to provide an open-loop reference circuit suitable for regulating the bit switch currents within a digital-to-analog converter circuit wherein the open-loop reference circuit is relatively immune to high frequency transients, thereby allowing the digital-to-analog converter circuit to settle rapidly.

It is another object of the present invention to provide an open-loop reference circuit of the type described above wherein the degree of regulation of the bit switch currents is comparable to that of a closed-loop reference circuit.

It is yet another object of the present invention to provide such an open-loop reference circuit which can absorb transients on the current source bias voltage conductor and thereby eliminate the necessity to purposely slow the response of the digital input interface circuitry.

It is still another object of the present invention to provide such an open-loop voltage reference circuit wherein the bias voltage may be conveniently varied in order to adjust the magnitudes of the bit switch currents without adversely affecting the temperature compensation of such currents.

SUMMARY OF THE INVENTION

Briefly described, and in accordance with one embodiment thereof, the present invention relates to an open-loop voltage reference circuit suitable for regulating the bit switch currents within a digital-to-analog converter, the open-loop voltage reference circuit including a zener diode reference leg, a slave leg, a current mirror, and an emitter follower drive leg. The zener diode reference leg conducts a first current and develops a reference voltage in response thereto. The reference voltage in turn biases a current within the slave leg which is substantially constant over variations in temperature and power supply voltage. The current mirror is coupled to the slave leg and is responsive to the current conducted thereby for supplying the first current to the zener diode reference leg and maintaining the first current substantially independent of variations in temperature and power supply voltage. The zener diode reference leg includes a base-emitter junction voltage multiplier for creating a compensating voltage having a temperature tracking coefficient that is equal and opposite to that of the zener diode junction voltage. Accordingly, the reference voltage developed by the zener diode reference leg includes as a component thereof a temperature compensated voltage. The reference voltage also includes as an additional component thereof one or more base-emitter junction voltages. The slave leg includes a like number of base-emitter junction voltages coupled in series with a resistor whereby the resulting voltage across the resistor within the slave leg is equal to the temperature compensated voltage component of the reference voltage; accordingly, the current within the slave leg is substantially constant over changes in temperature.

The open-loop voltage reference circuit also includes circuitry for receiving the reference voltage generated by the zener diode reference leg and deriving therefrom a bias voltage used to bias the plurality of bit switch current sources. In the preferred embodiment of the invention, a divider leg and an emitter follower drive leg are interposed between the reference voltage and the bias voltage in order to reduce the magnitude of the reference voltage and to provide a low impedance source of the bias voltage, respectively. Base-emitter junction voltages associated with a divider leg follower transistor and with an emitter follower transistor within the emitter follower drive leg are matched by base-emitter junction voltages within both the zener diode reference leg and within the slave leg. Each bit switch current source includes a current source transistor and a resistor in the emitter thereof, and the base-emitter junction voltage of each current source transistor is similarly matched by a base-emitter junction voltage within both the zener diode reference leg and within the slave leg. Accordingly, the voltage resulting across each emitter resistor within each bit switch current source is proportional to the temperature compensated voltage component of the reference voltage.

Changes in the power supply voltage vary the base-collector junction voltages of transistors within the slave leg and within the current mirror, resulting in variations in the current gain characteristics thereof. Such variations in power supply voltage similarly affect the current gain characteristics of the first current sharing transistor so as to maintain relatively constant the current supplied by the current mirror to the zener diode reference leg.

To effect adjustment of the magnitudes of the bit switch currents without adversely impacting the temperature compensation thereof, a resistor is coupled in series with the base terminal of the emitter follower transistor within the emitter follower drive leg, and a regulated current, adjustable in magnitude, is conducted to the base terminal of the emitter follower transistor for adjustably varying the bias voltage provided at the emitter thereof. In a preferred embodiment of the invention, a substantially constant current is derived from the slave leg current, and a gain adjust terminal is provided for allowing an externally generated current to be either added to or subtracted from the constant current. The constant current, augmented by the externally generated current, is conducted to the base terminal of the emitter follower transistor for adjusting the voltage thereat and thereby varying the magnitudes of the bit switch currents.

BRIEF DESCRIPTION OF THE DRAWINGS

FIGS. 1A–1C are a circuit schematic of a twelve bit digital-to-analog converter embodying the present invention.

FIG. 2 is a simplified circuit schematic of an open-loop voltage reference network for regulating the current within a bit switch and within a reference output leg.

FIG. 3 is a schematic of a portion of the circuitry shown in FIG. 1A used to generate a voltage reference output signal and additional bipolar offset circuitry for converting the analog output current to a bipolar analog voltage.

DETAILED DESCRIPTION OF THE PREFERRED EMBODIMENT

Figure 4:
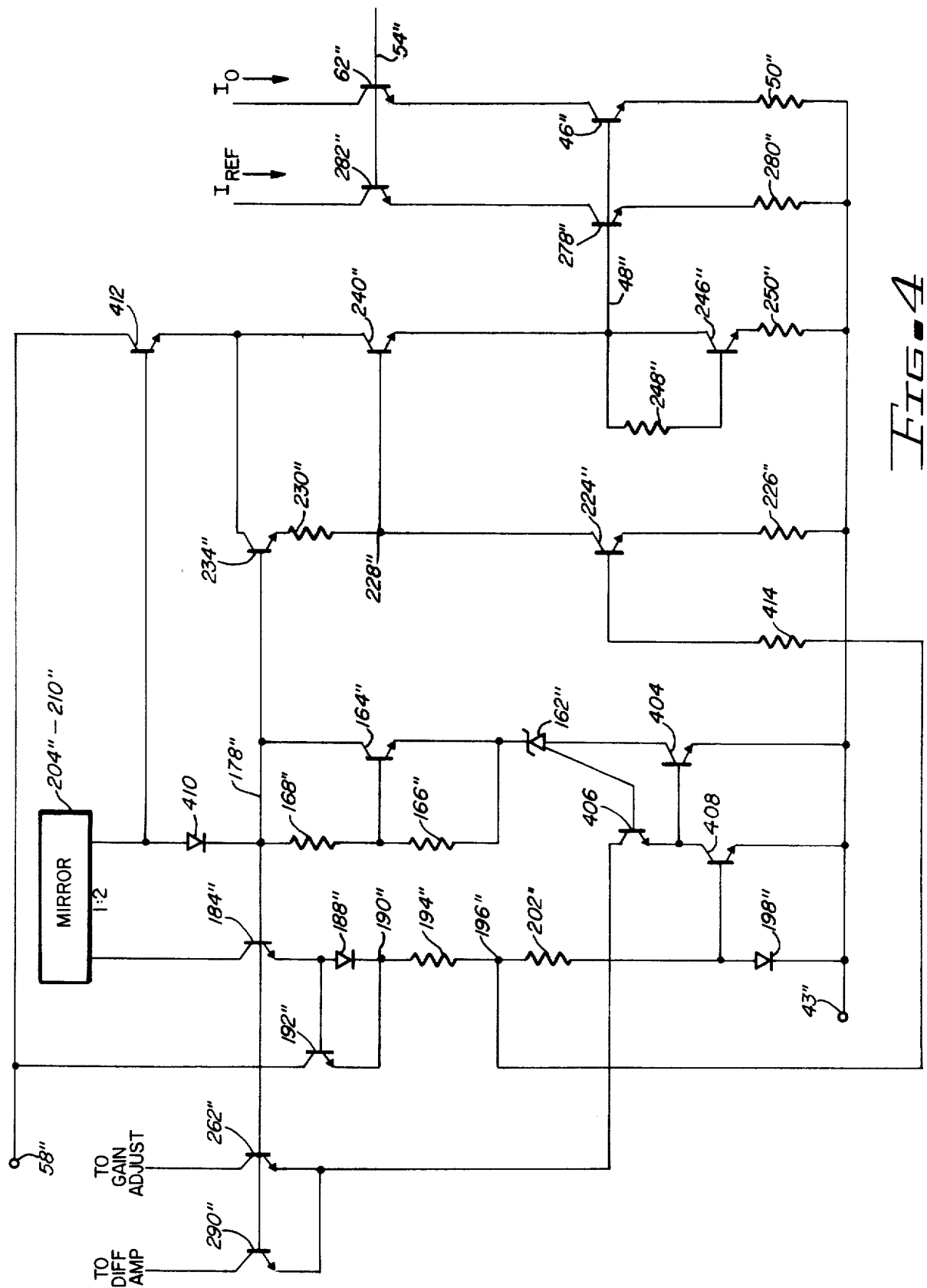
FIG. 4 is a circuit schematic of an alternate open-loop voltage reference circuit.

Shown in FIGS. 1A, 1B, and 1C is a twelve bit digital-to-analog converter circuit which forms one embodiment of the present invention. The digital-to-analog converter includes twelve digital input terminals, including those referenced 2, 4, 6, 8, 10, 12, and 14, for receiving a twelve bit binary-weighted input signal. Input terminal 2 corresponds to the most significant bit of the twelve-bit digital input signal; input terminal 4 receives the second most significant bit; and so forth, while input terminal 14 receives the least significant bit of the digital input signal.

Each of the twelve input terminals (2-14) has associated therewith a single-ended input network for interfacing with the received input signal and translating the received signal to a voltage level compatible with an associated bit switch current steering means. Typically, the received input signal is a non-negative voltage while the bit switches are powered from a negative power supply voltage.

The single ended input network associated with input terminal 2 includes diode-connected PNP transistor 16 having a base and a collector commonly coupled to input terminal 2 and having an emitter coupled to node 18. Transistor 16 is preferably fabricated as a lateral PNP transistor by appropriately diffusing a pair of P-type base diffusions within a lightly doped N-type epitaxial region. When transistor 16 is fabricated in this manner, its emitter-base junction has associated therewith a relatively large parasitic capacitance 20 shown in dashed lines within FIG. 1A. The significance of such parasitic capacitance is described in further detail below.

Resistor 22 is coupled between node 18 and a sub-regulated voltage supply rail 24 having a voltage of approximately +2.5 volts. The manner in which the voltage upon supply rail 24 is regulated is described in further detail below. Node 18 is also coupled to the base terminal of emitter follower transistor 26. The collector of transistor 26 is coupled to supply rail 24. The emitter of transistor 26 is coupled to emitter 28 of double emitter transistor 30. Transistor 30 includes an additional emitter 32 interconnected within a bit switch current steering means described below. The base terminal of transistor 30 is coupled by conductor 34 to the collector terminal of transistor 36. The base terminal of transistor 36 is coupled to a sub-regulated bias conductor 38 nominally maintained at approximately one volt above the negative power supply voltage. The emitter of transistor 36 is coupled by resistor 40 to a negative voltage supply conductor 42 which is in turn coupled to a negative power supply voltage terminal 43 ($-V_{CC}$) having a nominal magnitude of −15 volts.

With reference to transistor 30, the junction between emitter 28 and the base of transistor 30 is operated under reverse bias, resulting in a zener breakdown voltage of approximately 6.8 volts being produced thereacross. Accordingly, the voltage at the base of transistor 30 is approximately 6.8 volts below the voltage at the emitter of transistor 26. The voltage imposed upon bias conductor 38 and the value of resistor 40 are selected to maintain approximately 0.25 milliamp of current flowing through transistor 26 and through the zener junction of transistor 30. Accordingly, emitter follower transistor 26 and the zener junction of transistor 30 function to level-shift the voltage at node 18 to a more negative voltage at the base of transistor 30.

The above described input network is compatible with logic signals generated by TTL-type logic circuitry wherein a voltage level below approximately +1.4 volts corresponds to a logic "0" and wherein a voltage level above approximately +1.4 volts corresponds to a logic "1." Assuming that the voltage an input terminal 2 is significantly below +1.4 volts, then transistor 16 is conductive, and node 18 is approximately one base-emitter voltage more positive than the voltage at input terminal 2. However, if the voltage at input terminal 2 is significantly above +1.4 volts, then transistor 16 is nonconductive, and the voltage at node 18 rises to the voltage of supply rail 24 less a typically negligible voltage developed across resistor 22 due to the base current of emitter follower transistor 26.

A negative transition of the signal applied to input terminal 2 causes transistor 16 to become forward biased whereby the negative transition is rapidly coupled to node 18. Sufficient current is maintained wthin emitter follower transistor 26 to maintain transistor 26 conducting during such negative transitions at node 18. On the other hand, positive transitions of the input signal applied to input terminal cause transistor 16 to become non-conductive. Parasitic capacitances associated with node 18, with the emitter of transistor 26, with the base of transistor 30, and with the common emitter node of transistors 30 and 44, and extending therefrom to A. C. ground, all tend to delay the rise in voltage at node 18 and the ultimate switching of the bit switch current from transistor 44 to transistor 30. Were it not for capacitance 20 extending between input terminal 2 and node 18, all of the above-mentioned parasitic capacitances would be charged relatively slowly by pull-up resistor 22, and the switching speed of the bit switch would be correspondingly slow. However, capacitance 20 is of a magnitude to store more than sufficient charge to charge-pump each of the above mentioned parasitic capacitances by the change in voltage which appears at input terminal 2 when the digital input signal received thereby undergoes positive transition. Accordingly, node 18, the emitter of transistor 26, the base of transistor 30, and the common emitter node of transistor 30 and 44 each rapidly follow the positive transition at input terminal 2 due to the charge-pumping action of capacitance 20. In the preferred embodiment, transistor 16 is a lateral PNP transistor, and the parasitic capacitance of the emitter-base junction thereof is sufficiently large to provide such charge-pumping action. It would also be possible to utilize an NPN type transistor as transistor 16, in which case, the emitter and base of the NPN transistor would be coupled to input terminal 2 and node 18, respectively. However, since the emitter-base parasitic capacitance of an NPN transistor is typically relatively small, a separate capacitance 20 would preferably be coupled between input terminal 2 and node 18 of a magnitude to store a sufficient charge required to charge-pump parasitic capacitances to A. C. ground associated with node 18, the emitter of transistor 26, the base of transistor 30, and the common emitter node of transistors 30 and 44 by the positive change in voltage appearing at input terminal 2.

Accordingly, the input network formed by transistors 16 and 26, the zener junction of transistor 30, transistor 36, and resistor 40 operates to rapidly couple both positive and negative transitions of the input logic signal applied at input terminal 2 to the base of transistor 30. Moreover, because transistor 16 is constructed as a lateral PNP transistor, the reverse breakdown voltage of the emitter-base junction thereof is relatively high, thereby allowing the input signal to be a relatively large positive voltage without adversely affecting the input network.

Still referring to transistor 30, emitter 32 is coupled to the emitter of transistor 44 in order to form an emitter-coupled bit switch or current steering means. Emitter 32 of transistor 30 and the emitter of transistor 44 are each coupled to the collector of current source transistor 46. The base terminal of transistor 46 is coupled to a conductor 48 which conducts a carefully regulated reference voltage generated by an open loop reference circuit to be described in further detail below. A pair of laser-trimmable resistors 50 and 52, coupled in parallel with one another, extend between the emitter of transistor 46 and negative voltage supply conductor 42. In the preferred embodiment of the present invention, resistors 50 and 52 are fabricated by thin film deposition of nichrome upon the upper surface of the monolithic integrated circuit to facilitate laser trimming and to maintain a relatively low temperature coefficient for the resistance values associated with such resistors. As will be explained below, the voltage on conductor 48 is regulated so as to maintain a substantially constant current at the collector terminals of transistors 30 and 44. In the preferred embodiment of the present invention, the current which flows through the most significant bit switch is approximately one milliamp.

The base of transistor 44 is coupled to a threshold voltage conductor 54 having a voltage approximately corresponding to that appearing at the base of transistor 30 when the voltage at input terminal 2 is at +1.4 volts. Accordingly, when the voltage at input terminal 2 is substantially below +1.4 volts, the voltage at the base of transistor 30 will similarly be substantially below the voltage at the base of transistor 44, and all of the bit switch current provided by current source transistor 46 will be conducted by transistor 44. On the other hand, if the voltage at input terminal 2 is substantially above +1.4 volts, then the voltage at the base of transistor 30 will be substantially more positive than the voltage at the base of transistor 44, and emitter 32 of transistor 30 will conduct all of the bit switch current provided by current source transistor 46. The manner in which the voltage on threshold voltage conductor 54 is provided will be described in further detail below.

The collector of transistor 30 is coupled to waste current conductor 56 which, in turn, is coupled to Common pad 58. In the preferred embodiment of the present invention, Common pad 58 is interconnected by a wire bond to an integrated circuit package pin coupled to ground potential. On the other hand, the collector of transistor 44 is coupled to output conductor 60 which is connected both to I$_{OUT}$ pad 62 and to Sense pad 64. In the preferred embodiment, I$_{OUT}$ pad 62 is wire bonded to the integrated circuit package pin which provides the analog output current determined by the twelve bit input digital word. Sense pad 64 is utilized during fabrication of the monolithic integrated circuit for sensing the voltage upon conductor 60 during laser trimming of resistors.

The input network associated with the second most significant bit of the digital-to-analog converter is essentially identical to that used for the most significant bit and includes diode-connected PNP transistor 66, resistor 68, emitter follower transistor 70, zener connected emitter 72, current source transistor 74, and resistor 76. Input terminal 4 and its associated input network control the second most significant bit switch formed by emitter-coupled transistors 78 and 80. Current source transistor 82 has its collector terminal coupled to the emitters of transistors 78 and 80, its base terminal coupled to reference voltage conductor 48, and its emitter coupled by laser trimmable resistor 84 to negative voltage supply conductor 42. The base terminal of bit switch transistor 80 is coupled to threshold voltage conductor 54. The collector terminal of transistor 78 is coupled to waste conductor 56, and the collector terminal of transistor 80 is coupled to the output conductor 60.

The current which flows through the second most significant bit switch is one-half milliamp, or one-half of the current flowing through the most significant bit switch. Accordingly, the emitter area of current source transistor 82 is scaled to be one-half that of current source transistor 46. In addition, resistor 84 is fabricated to be identical with resistors 50 and 52. In this manner, the current density of the current source transistor associated with the second most significant bit switch is essentially the same as the current density of the corresponding current source transistor associated with the most significant bit switch, thereby resulting in like characteristics.

Referring now to the third most significant bit, the input signal applied to input terminal 6 controls a similar bit switch formed by emitter 86 of transistor 88 and transistor 90. The input network coupled between input terminal 6 and the base of transistor 88 is identical to that used for the most significant bit and second most significant bit described above. The base of transistor 90 is coupled to threshold voltage conductor 54. Current source transistor 92 has its collector terminal coupled to the common emitters of of transistors 88 and 90, its base terminal coupled to reference voltage conductor 48 and its emitter coupled through a pair of series connected laser-trimmable resistors 94 and 96 to negative voltage supply conductor 42. Resistors 94 and 96 are each identical to resistors 50, 52 and 84. Accordingly, the current which flows through the third most significant bit switch formed by transistors 88 and 90 is 0.25 milliamp, or one-half of the current flowing through the second most significant bit switch and one-fourth of that flowing through the most significant bit switch. In addition, the emitter area of current source transistor 92 is scaled to be one-half that of current source transistor 82. The collector of transistor 88 is coupled to waste conductor 56, while the collector of transistor 90 is coupled to output conductor 60.

Each of the three most significant bit switches functions to steer its associated bit switch current either through output conductor 60 or through waste conductor 56 as determined by the status of the three most significant bits of the twelve bit digital input signal. Each of the currents contributed by the three most significant bit switches to I$_{OUT}$ pad 62 is determined by the scaled currents flowing within current source transistors 46, 82 and 92.

Referring now to the fourth most significant bit, input terminal 8 is coupled by an input network identical to those input networks previously described to a bit switch formed by transistors 98 and 100. The common emitters of transistors 98 and 100 are coupled to the collector terminal of a current source transistor 102. The base terminal of transistor 102 is coupled to reference voltage conductor 48, and its emitter is coupled through laser-trimmable resistor 104 to negative voltage supply conductor 42.

The current flowing within the fourth most significant bit switch formed by transistors 98 and 100 is 0.5 milliamps. Accordingly, the emitter area scaling for current source transistor 102 is identical to that of current source transistor 82. Similarly, resistor 104 is identical to resistor 84 within the second most significant bit switch. The base terminal of transistor 100 is coupled to threshold voltage conductor 54. The collector terminal of transistor 98 is coupled to a first ladder common (or waste current) conductor 106 rather than to waste conductor 56 utilized in conjunction with the three most significant bits. The collector terminal of transistor 100 is coupled to node 108 of an R-2R ladder network utilized to scale in binary weighted fashion the current contributions from the bit switches controlled by the nine least significant bits of the twelve bit digital input word.

The ladder network used for scaling the total current contributions from the nine least significant bit switches includes six series-coupled resistors 109, 110, 111, 112, 113, and 114 extending, respectively, from node 108 to conductor 116, which conductor is coupled to $I_{OUT}$ pad 62. It should be noted that conductor 116 represents a metal trace within the integrated circuit separate and apart from the metal trace represented by conductor 60. Each of the metal traces represented by conductors 60 and 116 has a small amount of resistance associated therewith. By coupling ladder network resistors 109-114 to $I_{OUT}$ pad 62 by a conductor (116) separate and apart from conductor 60, non-constant voltage drops in conductor 116 which would otherwise result due to switching of the three most significant bit switch currents being conducted therethrough are avoided.

Referring again to the ladder network, resistors 109-114 each have an identical resistance value which, in the preferred embodiment of the invention, is 900 ohms. If 900 ohms is considered as being one unit R, then 6R are interposed between $I_{OUT}$ pad 62 and node 108. Node 108 is coupled by resistor 118 to node 120. Node 120 is coupled by two series connected shunt resistors 122 and 124 to a second ladder common conductor 126. Resistor 118 has a resistance value of one unit R or 900 ohms. Similarly, resistors 122 and 124 each have a resistance value of one unit R or 900 ohms. The ladder network continues to the right (with reference of FIG. 1C) wherein node 120 is coupled to successive like nodes by series connected resistors of unit R, and wherein each of said like nodes is coupled to ladder common conductor 126 by shunt branches comprising two series-connected resistors each of unit R. The last node of the ladder network is shown as node 133 and is described in further detail below.

Referring again to the fourth most significant bit switch formed by transistors 98 and 100, the current flowing therein is set at 0.5 milliamp, equal to the current flowing within the second most significant bit switch. However, in order to maintain the proper binary weighting, the output current contributed by the fourth most significant bit switch should be only one-fourth that of the current contributed by the second most significant bit switch. Viewed from node 108, the equivalent circuit of the ladder network consists of 6R extending to $I_{OUT}$ pad 62 and 2R extending to ladder common conductor 126. Assuming that the $I_{OUT}$ pad 62 and ladder common conductor 126 are each essentially at ground voltage, one-fourth of the current conducted by transistor 100 of the fourth most significant bit switch is sourced from $I_{OUT}$ pad 62, and the remaining three-fourths of the current is sourced from ladder common conductor 126. Accordingly, the fourth most significant bit switch contributes only 0.125 milliamp to $I_{OUT}$ pad 62.

The fifth most significant bit switch includes emitter-coupled transistors 128 and 130. The current flowing through the fifth most significant bit switch is the same as that flowing through the fourth most significant bit switch, or 0.5 milliamp. The collector of transistor 130 is coupled to node 120. Viewed from node 120, 7R extends between it and $I_{OUT}$ pad 62. The remainder of the ladder network presents an equivalent resistance of 1R between node 120 and ladder common conductor 126. Accordingly, one-eighth of the current conducted by transistor 130 is sourced from $I_{OUT}$ pad 62, while the remaining seven-eighths of such current is sourced from ladder common conductor 126. Therefore, transistor 130 contributes only 62.5 microamp of current to $I_{OUT}$ pad 62, or half as much as the fourth most significant bit switch.

As described above, the currents flowing within the fourth and fifth most significant bit switches are each 0.5 milliamp. Similarly, the bit switch currents of the remainder of the lesser significant bit switches, with the exception of the two least significant bit switches, are equal to 0.5 milliamp. Since each bit switch conducts a current on the same order of magnitude as the other bit switches, all of the bit switches have approximately equal switching speeds; this result would not be obtained were the scaling of currents contributed by each bit switch achieved by scaling the bit switch currents (as by using a ladder network to scale the currents conducted by the current source transistors within each bit switch).

The dashed lines extending to the right of the fifth most significant bit switch within FIG. 1C designate the next succeeding five bit switches and R-2R ladder network connections therefor. The last stage of the ladder network includes series resistor 129 coupled to node 133 and shunt resistor 131 coupled from node 133 to ladder common conductor 126. Resistors 129 and 131 each have a valve of one unit R, or 900 ohms. Conductor 135 couples node 133 to a bit switch transistor within the third least significant bit switch (not shown). Each of these next five succeeding bit switches is identical to the fifth most significant bit switch. For each successive bit switch, the ladder network continues to divide by two the current contributed by each bit switch to the $I_{OUT}$ pad 62 relative to the current contributed by the immediately preceding bit switch.

Still referring to FIG. 1C, the bit switch for the second least significant bit includes emitter-coupled transistors 132 and 134. The common emitters of transistors 132 and 134 are coupled to the collector of current source transistor 136. Input terminal 12 is coupled to the base of transistor 132 by an input network identical to that previously described. The base of transistor 134 is coupled to threshold voltage conductor 54. The current flowing through the second least significant bit switch is maintained at 0.25 milliamp, or half the current maintained within the seven preceding bit switches, in a manner described below.

The least significant bit switch includes emitter coupled transistors 138 and 140. Input terminal 14 is coupled to the base of transistor 138 by an input network identical to that described above. The base of transistor 140 is coupled to threshold voltage conductor 54. The common emitters of transistors 138 and 140 are coupled to the collector of current source transistor 142. The current maintained within the least significant bit switch is 0.125 milliamp, or half that maintained within the second least significant bit switch.

Current source transistors 136 and 142 each have their base terminals coupled to voltage reference conductor 48 and their emitters coupled in common to one end of resistor 144, the opposite end of which is coupled to negative voltage supply conductor 42. Additionally, transistor 146 has its base and emitter terminals coupled in common with the base and emitter terminals, respectively, of transistors 136 and 142. The emitter area of transistor 136 is one-half that of current source transistor 102, while the emitter areas of transistors 142 and 146 are each one-fourth that of current source transistor 102. Accordingly, the sum of the emitter areas of transistors 136, 142 and 146 is equal to the emitter area of current source transistor 102. Resistor 144 is equal in value to resistor 104 coupled to the emitter of current source transistor 102. Accordingly, the current conducted by resistor 144 is 0.5 milliamp, equal to the current conducted through the fourth most significant bit switch. However, transistor 136, 142, and 146 distribute the current conducted by resistor 144 whereby transistor 136 conducts 0.25 milliamp and transistors 142 and 146 each conduct 0.125 milliamp. The collector of transistor 146 is coupled to conductor 148 which in turn is connected to Common pad 58.

Since the scaling of the current contribution from the second least significant bit switch and the least significant bit switch is achieved by current source transistors 136 and 142, the previously described ladder network need not be extended beyond the third least significant bit switch. Accordingly, the collectors of transistors 134 and 140 are coupled directly to node 133 of the ladder network without any intervening series or shunt resistance.

It will be noted that the first ladder common conductor 106 (which conducts the "waste" currents not directed to the ladder network) and the second ladder common conductor 126 are each separate from waste conductor 56 and are each ultimately coupled to Ladder Common pad 150 formed within the integrated circuit. In the preferred embodiment of the present invention, a second wire bond pad 152 (AMP+IN) is formed remote from Ladder Common pad 150 and is coupled thereto. Pad 152 facilitates the coupling of a wire bond from the digital-to-analog converter integrated circuit to an additional integrated circuit (such as an op-amp) for coupling ground potential thereto.

Ladder Common pad 150 and Common pad 58 are separately wire bonded to a single package pin coupled to ground potential. As described above, Common pad 58 is coupled to conductor 56 which in turn is coupled to the three most significant bit switches for conducting the waste currents therefrom. On the other hand, Ladder Common pad 150 is coupled to the nine least significant bit switches. As previously mentioned, metal traces fabricated within an integrated circuit inherently include a small amount of resistance. Provision of separate Common and Ladder Common pads 58 and 150 is advantageous because the switching of current within the three most significant bit switches does not affect the voltages which result at various points along ladder common conductor 126. Therefore, the ability of the ladder network to accurately and linearly scale the current contributions of the nine least significant bit switches is greatly enhanced. Since a package pin itself has an extremely small resistance associated therewith, very little linearity error results from wire bonding Common pad 58 and Ladder Common pad 150 to the same package pin.

As shown in FIG. 1C, conductor 106 is coupled to conductor 126 at node 127. In some cases node 127 may be physically far removed from Ladder Common pad 150, in which case a significant metal trace resistance may exist. This metal trace resistance is schematically represented by dashed box 137 within FIG. 1C, and conductor 126' represents the portion of conductor 126 which is primarily between Ladder Common pad 150 and dashed box 137. In order to improve the linearity of the ladder network, it is essential that the waste currents conducted by conductor 106 be conducted to conductor 126 on the side of dashed box 137 opposite Ladder Common pad 150. Were node 127 to appear on conductor 126' rather than on conductor 126, then the variations in voltage across the metal trace resistance represented by dashed box 137 would create significant errors in the currents scaled by the ladder network.

The open loop voltage reference circuit used to regulate the current within each of the bit switches of the digital-to-analog converter will now be described with reference to FIGS. 1A and 1B. The voltage reference circuit includes a zener diode reference leg designated generally by reference numeral 154 for conducting a first current and generating a temperature compensated voltage component in response thereto. More particularly, reference leg 154 includes a diode-connected transistor 156 having its emitter coupled to the negative voltage supply conductor 42 and having its base and collector coupled to node 158. Extending between node 158 and node 160 is a zener diode 162. In the preferred embodiment of the present invention, zener diode 162 is fabricated as a buried zener in order to make its characteristics more stable over time. Such a buried zener junction may be formed by initially diffusing a heavily doped P-type isolation region at a point within the monolithic integrated circuit, and subsequently diffusing a heavily doped N-type emitter area on top of the previously diffused P-type region, thereby creating an abrupt P-N junction below the surface of the monolithic circuit. In order to contact the P-type side of the zener junction, a P-type base region is diffused prior to emitter diffusion. The P-type base region overlies the isolation region and extends laterally beyond the emitter diffusion on first and second opposing sides thereof for permitting first and second contacts, respectively, to be made to the P-type side of the zener junction. The N+ emitter region is interconnected to node 160, and the first and second contacts to the P-type base region are interconnected to node 158.

Reference leg 154 further includes a base-emitter junction voltage ($V_{BE}$) multiplier formed by transistor 164 and laser trimmable resistors 166 and 168. The emitter of transistor 164 is coupled to node 160, and its base and collector terminals are coupled to nodes 170 and 172, respectively. Resistor 166 is coupled between node 160 and node 170, and resistor 168 is coupled between node 170 and node 172. Trim Sense pad 174 is coupled to node 172 for allowing the voltage at node 172 to be probed and sensed during laser trimming operations. Node 172 is also coupled to the emitter of transistor 176; the collector of transistor 176 is coupled to voltage reference rail 178, and the base of transistor 176 is coupled by resistor 180 to voltage reference rail 178.

The current conducted by reference leg 154 causes voltage reference rail 178 to be biased by a predetermined voltage above negative voltage supply conductor 42. In response to the voltage biased upon voltage reference rail 178, a current is generated within an adjacent slave leg designated generally by reference numeral 182. Slave leg 182 includes a transistor 184 having its base coupled to voltage reference rail 178 and its emitter coupled to node 186. Node 186 is coupled to the base and collector terminals of a diode-connected transistor 188, the emitter of which is coupled to node 190. Transistor 192 has its base and emitter terminals coupled in common with the base and emitter terminals, respectively, of transistor 188. However, the emitter area of transistor 192 is scaled to be three times that of transistor 188. Accordingly, transistor 192 conducts three times as much current as transistor 188. The collector of transistor 192 is coupled by conductor 148 to Common pad 58. Node 190 is coupled through resistor 194 to node 196. Transistor 198 has its collector directly coupled to node 196 and its base coupled through resistor 200 to node 196. The emitter of transistor 198 is coupled through resistor 202 to the negative supply voltage conductor 42. In the preferred embodiment of the present invention, the magnitudes of resistors 194, 200, and 202 are all equal to one another and are approximately 3.3K ohms.

A portion (one-fourth) of the current generated within slave leg 182 in response to the bias voltage established by reference leg 154 is conducted through a PNP current mirror circuit which includes transistors 204 and 210–213. By dividing the current in the slave leg by four before conducting the same through the PNP current mirror, current densities within the PNP transistors are reduced. PNP transistors fabricated in monolithic integrated circuits typically do not function as well at higher current densities. Furthermore, the $\beta$ (current amplification factor) for such transistors is significantly higher at lower current densities. Higher $\beta$ results in smaller nominal base currents within the PNP transistors; consequently, errors introduced by changes in such base currents (e.g., due to changes in temperature or power supply voltage) have correspondingly smaller magnitudes.

The collector of transistor 184 is coupled to the collector of PNP transistor 204 as well as to the base of PNP transistor 206. The emitter of transistor 204 is coupled through resistor 208 to common conductor 148. The base of transistor 204 is coupled in common with the base terminals of PNP transistors 210, 211, 212, and 213. The base of transistor 204 is also coupled by resistor 214 to the emitter of transistor 206. The collector of transistor 206 is connected to negative power supply voltage conductor 42. Although transistor 204 could have its base and collector coupled in common, the addition of transistor 206 diverts the base currents of transistors 204 and 210–213 to ground and also prevents saturation of transistor 204 at higher temperatures. Resistor 214 is inserted in series with the emitter of transistor 206 to avoid oscillation.

The emitters of transistors 210 and 211 are coupled in common to one end of resistor 216, the other end of which is coupled to common conductor 148. Similarly, the emitters of transistors 212 and 213 are coupled in common to one end of resistors 218, the opposite end of which is coupled to common conductor 148. The emitter areas of transistors 204, 210, 211, 212, and 213 are all equal to one another and resistors 216 and 218 are each one-half the magnitude of resistor 208. Accordingly, the current collectively conducted by transistors 210 and 211 is twice that conducted by transistor 204. Similarly, the current conducted collectively by transistors 212 and 213 is twice that conducted by transistor 204. The collector terminals of transistors 210, 211, 212 and 213 are coupled in common to voltage reference rail 178 for supplying a mirrored current thereto. The mirrored current provided by transistors 210–213 is essentially four times the current conducted by transistor 184, or approximately equal to the current conducted by slave leg 182. Substantially all of the mirrored current provided by transistors 210–213 to voltage reference rail 178 is conducted by reference leg 154 for establishing the reference voltage on reference rail 178 (all other currents drawn from voltage reference rail 178 are relatively small base currents).

In order to ensure that some current initially flows through reference leg 154, device 220, known as an epi-FET, is coupled between common conductor 148 and voltage reference rail 178. As is known to those skilled in the art, an epi-FET may be fabricated by isolating an elongated N-type epitaxial region and subsequently diffusing a P-type base region extending laterally across the central portion of the elongated epitaxial region. One end of the elongated epitaxial region is coupled to common conductor 148, and the opposite end is coupled to voltage reference rail 178. The P-type base region extends into P-type isolation and is thereby biased through the substrate to the negative power supply voltage.

Assuming that no current is initially flowing through reference leg 154, the voltage on reference rail 178 will be substantially equal to the negative voltage supply. In this event, epi-FET device 220 is biased to conduct current to voltage reference rail 178 which current is initially conducted by the base of transistor 184. The resulting collector current in transistor 184 is mirrored by the PNP current mirror, and the mirrored current is injected into voltage reference rail 178. The additional current supplied by the PNP current mirror is conducted by the base of transistor 184 to further increase the collector current thereof. This regenerative operation continues until the voltage on voltage reference rail 178 is sufficiently large to break down zener diode 162 and render reference leg 154 operative, whereupon voltage reference rail 178 stabilizes at its equilibrium condition. As the voltage of reference rail 178 rises, epi-FET device 220 becomes pinched-off and is essentially non-conductive when voltage reference rail 178 rises to its equilibrium condition.

The magnitude of the voltage between voltage reference rail 178 and negative supply voltage conductor 42 is relatively large since this voltage includes the voltage drop across zener diode 162 as well as several forward biased base-emitter junction voltages. A divider leg, designated generally by reference numeral 222, is included within the open loop voltage reference circuit in order to derive a secondary reference voltage having a magnitude (as measured from negative voltage supply conductor 42) of approximately one-half that of the voltage on reference rail 178. The current within divider leg 222 is primarily determined by transistor 224 and resistor 226. The base of transistor 224 is coupled to node 196 within slave leg 182. The emitter of transistor 224 is coupled by resistor 226 to negative supply voltage conductor 42. The emitter areas of transistors 224 and 198 are equal to one another, and the values of resistors 226 and 202 are equal to one another. Consequently, the current conducted by transistor 224 mirrors the current conducted by slave leg 182.

The collector of transistor 224 is coupled at node 228 to one end of resistor 230 and to one end of resistor 232. The opposite end of resistor 230 is coupled to the emitter of transistor 234, the base terminal of which is coupled to voltage reference rail 178. The collector of transistor 234 is coupled to common conductor 148. Consequently, the voltage at node 228 is derived from the voltage appearing on voltage reference rail 178 but is decreased by the base-emitter junction voltage of transistor 234 and by the voltage drop across resistor 230. In the preferred embodiment of the present invention, resistors 226 and 230 each have a value of 3.3K ohms.

The voltage developed at node 228 by divider leg 222 is substantially reduced from the reference voltage developed on reference rail 178. Nonetheless, node 228 has a relatively high impedance associated therewith. As is known to those skilled in the art, it is desirable to drive the current source transistors (46, 82, 92, 102, etc.) within the bit switches with a relatively low impedance node in order to provide sufficient drive current to such transistors and in order to exhibit immunity from transients imposed upon reference voltage conductor 48 due to rapid switching of one or more bit switches. Accordingly, an emitter follower drive leg, designated generally by reference numeral 238, is included within the open loop reference circuit for providing a low impedance drive point coupled to voltage reference conductor 48.

Resistor 232 is coupled between nodes 228 and 236 for connecting emitter follower drive leg 238 to divider leg 222. Insertion of resistor 232 between nodes 228 and 236 increases the impedance between voltage reference rail 178 and drive leg 238, thereby further isolating voltage reference rail 178 from transients induced upon voltage reference conductor 48 due to switching action of the bit switches. In the preferred embodiment, resistor 232 has a value of 3.3K ohms. Emitter follower transistor 240 has its base terminal coupled to node 236 and its emitter terminal coupled to node 242 for driving voltage reference conductor 48. The collector of transistor 240 is coupled to the emitter of transistor 244, the base and collector terminals of which are coupled to voltage reference rail 178 and to common conductor 148, respectively. Transistor 244 serves to couple the collector of transistor 240 to ground while maintaining the base-collector voltage of transistor 240 essentially constant regardless of variations in the negative power supply voltage.

Node 242 is also coupled to the collector of transistor 246 and to one end of resistor 248, the opposite end of which is coupled to the base terminal of transistor 246. The emitter of transistor 246 is coupled through resistor 250 to negative voltage supply conductor 42. The emitter area of transistor 246 is equal to that of current source transistor 46 within the most significant bit switch, and the magnitude of resistor 250 is 3.3K ohms, or one-half that of resistors 50 and 52 within the most significant bit switch. Accordingly, the current density and temperature tracking characteristics of transistor 246 are substantially identical to those for the current source transistors associated with each of the bit switches.

The manner in which the open loop voltage reference circuit shown in FIGS. 1A-1B maintains the bit switch currents constant and independent of variations in temperature and voltage supply will now be described with reference to the simplified schematic diagram shown in FIG. 2 wherein like devices, nodes, and conductors are referenced with primed numerals corresponding to those appearing in FIGS. 1A-1C. Unless otherwise specified, all references to voltage are with respect to the negative power supply voltage. Referring first to the reference leg, zener diode 162' has a positive temperature coefficient, i.e., the voltage across zener diode 162' increases at a particular tracking rate with increasing temperature, assuming that the current conducted thereby is substantially constant. As is known to those skilled in the art, the base-emitter junction voltage of transistor 164' has a negative temperature coefficient, i.e., the base-emitter junction voltage decreases at a particular tracking rate with increasing temperatures, assuming that transistor 164' conducts a constant current. Generally speaking, the temperature coefficient of zener diode 162' is approximately within the range of 1.25 to 1.5 times as large as the temperature coefficient of the base-emitter junction voltage of transistor 164'.

Transistor 164' and resistors 166' and 168' are interconnected to form a so-called $V_{BE}$ multiplier wherein the voltage developed across resistor 168' is proportional to the base-emitter junction voltage of transistor 164' in the ratio of the magnitudes of resistors 168' and 166'. Accordingly, assuming that resistor 168' is approximately 1.25 times as large as resistor 166', then the voltage drop across resistor 168' will be 1.25 times as large as the base-emitter junction voltage of transistor 164'. By proper selection of the ratio of resistors 166' and 168', the temperature coefficient of the voltage generated across resistor 168', can be made approximately equal and opposite to that of the voltage across zener diode 162'. Resistors 166' and 168' are laser trimmable to permit adjustment of the $V_{BE}$ multiplier in accordance with the particular temperature coefficients of zener diode 162' and the base-emitter junction of transistor 164'. In the preferred embodiment, resistors 166' and 168' may be trimmed to vary the voltage across resistor 168' to a value within the range of approximately 1 to 3 times that of the base emitter junction voltage of transistor 164'. Consequently, the sum of the voltages produced across zener diode 162' and across resistor 168' is a constant voltage $V_{COMP}$ independent of variations in temperature, provided that the current is maintained relatively constant within the reference leg.

The voltage on reference rail 178' is equal to the sum of the voltages across diode 156', diode 176' and the base-emitter junction of transistor 164' plus $V_{COMP}$. Therefore, the voltage on reference rail 178' decreases at three times the temperature coefficient of a base-emitter junction voltage, assuming that the current $I_Z$ within the reference leg is maintained constant.

Referring now to the slave leg shown in FIG. 2, the temperature coefficient of voltage reference rail 178' is exactly compensated by the negative temperature coefficients of the three base-emitter junction voltages associated with transistor 184', diode 188' and diode 198'. Therefore, a constant voltage results across resistors 194' and 202' and, hence, a constant current $I_1$ flows within the slave leg.

In order to maintain the current $I_Z$ within the reference leg constant, the constant current $I_1$ within the slave leg is mirrored by transistors 204' and 210' and supplied back to the reference leg. The current supplied by transistor 210' to voltage reference rail 178' is proportional to constant current $I_1$. Since the base currents drawn by transistors 184', 234', 244' and 282' are negligible with respect to the current conducted by the reference leg, the constant current supplied by transistor 210' essentially flows through the reference leg, thereby providing a current $I_Z$ thereto that is substantially constant regardless of changes in temperature or power supply voltage. Thus, the zener diode reference leg sets its own current by developing a voltage used to bias a current within the slave leg, which slave leg current is then mirrored back to the zener diode reference leg.

Because current $I_1$ within the slave leg is constant, the voltage at node 196' has a temperature coefficient equal to the temperature coefficient of the base-emitter junction voltage of diode 198'. The current densities within the emitter-base junctions of transistors 224' (in the divider leg) and 278' (in the reference output leg) match that of diode 198'. Similarly, resistors 226' (in the divider leg) and 280' (in the reference output leg) are identical to resistor 202'. Accordingly, current $I_1''$ conducted within the divider leg and current $I_1'$ conducted within the reference output leg are identical to current $I_1$ within the slave leg and are therefore also substantially temperature and voltage supply independent.

As mentioned above, the voltage on reference rail 178' is equal to $V_{COMP}$ plus three base-emitter junction voltages. Thus, the sum of the voltages across resistors 194' and 202' within the slave leg is a constant equal to $V_{COMP}$. The values of resistors 194' and 202' are preferably chosen to be equal; therefore, the voltage at node 196' is equal to one-half of $V_{COMP}$ plus the base-emitter junction voltage of diode 198'. Consequently, the voltage across resistor 226' within the divider leg is equal to one-half of $V_{COMP}$. Resistor 230' within the divider leg is selected to be equal to resistor 226' and, hence, the voltage drop across resistor 230' is also equal to one-half of $V_{COMP}$. The resulting voltage at node 228' is the voltage of reference rail 178' less the sum of the voltages across the base-emitter junction of transistor 234' and across resistor 230', i.e., $$V_{228'} = (V_{COMP} + 3V_{BE}) - (V_{BE} + V_{230'})$$
$$= V_{COMP} + 3V_{BE} - V_{BE} - (\tfrac{1}{2})(V_{COMP})$$
$$= 2V_{BE} + (\tfrac{1}{2})V_{COMP}$$

Thus, the $V_{COMP}$ component of the voltage upon voltage reference rail 178' is halved at node 228' by the divider leg. It is desirable to reduce the magnitude of the $V_{COMP}$ component that is passed to reference voltage conductor 48' to permit operation of the digital-to-analog converter circuit at reduced negative power supply voltages without saturating the bit switch current source transistors.

Still referring to FIG. 2, the emitter follower drive leg includes emitter follower transistor 240' as well as diode 246' and resistor 250' for maintaining a bias current flowing through transistor 240'. The emitter follower drive leg provides a low impedance drive point for driving reference voltage conductor 48'. The low impedance associated with the emitter follower drive leg also serves to quickly absorb any transient currents conducted by voltage reference conductor 48' due to switching action within the plurality of bit switches, thereby allowing conductor 48' to stabilize quickly, and, in turn, allowing the analog output current derived from the bit switch currents to rapidly settle to its final value. Resistor 250' (within the emitter follower leg) is equal in value to resistors 194' and 202' (within the slave leg) and to resistors 226' and 230' (within the divider leg). The emitter areas of transistor 240' and diode 246' (within the emitter follower leg) are the same as those of devices 156', 176', 184', 188', 198', 224' and 234'. Accordingly, the current levels and resulting base-emitter voltage drops for transistor 240' and diode 246' match those of devices 156', 176', 184', 188', 198', 224' and 234'. Thus, the emitter follower leg current $I_F$ is essentially constant and is equal in magnitude to currents $I_1$, $I_1'$, and $I_1''$. Moreover, the voltage on conductor 48' is one-half of $V_{COMP}$ plus one base-emitter junction voltage.

Referring now to the bit switch illustrated in FIG. 2, the emitter area of transistor 46' and the value of resistor 50' are selected for establishing a current density within transistor 46' equal to that within transistor 240'. Thus, the base-emitter junction voltage of transistor 46' and the temperature coefficient thereof match that of the active devices within the reference leg, slave leg, divider leg and emitter follower drive leg. Therefore, the resulting voltage across resistor 50' within the bit switch is a substantially constant voltage equal to one-half of $V_{COMP}$. Since $V_{COMP}$ is a constant voltage independent of temperature and power supply voltage, the resulting current $I_L$ flowing within the bit switch is also constant. In summary, the base-emitter junction voltages associated with transistors 46' (within the bit switch), 240' (within the emitter follower drive leg), and 234' (within the divider leg) are cancelled by diodes 156' and 176' and the base-emitter junction voltage of transistor 164' within the reference leg.

The above analysis of the circuit shown in FIG. 2 ignores second order error effects due to temperature and voltage supply induced variations in the current gain (or $\alpha$) within the transistors included within the open loop reference circuit. It is well known that a change in temperature is accompanied by a change in the current gain of a transistor. It is also well known that a change in the base-collector voltage of a transistor, as may result from changes in the negative power supply voltage, is accompanied by a change in the current gain of the transistor as well as a change in the emitter efficiency of the transistor. The latter phenomenon relating to base-collector voltage is commonly referred to as the Early effect.

Base-collector voltage variation can be eliminated with respect to some transistors merely by adding emitter follower transistors at appropriate points in order to clamp the collector voltages of such transistors at a voltage referenced to the negative power supply voltage. For example, base-collector voltage variation on transistors 240' and 278' is eliminated by adding transistors 244' and 282', respectively. However, transistors 46', 184', 210' and 234' are all susceptible to Early effect variation. The bit switch current conducted by the collector of transistor 44' is succeptible to variation due to temperature induced changes in the current gain of transistors 44' and 46'. Similarly, the reference current conducted by the collector of transistor 284' in the reference output leg is succeptible to variation due to changes in current gain of transistors 278' and 282' induced by changes in temperature.

In order to compensate for variations of current gain induced by changes in temperature, it will be noted that diode 246' within the emitter follower drive leg shown in FIG. 2 has been replaced by transistor 246 and base resistor 248 within FIGS. 1A-1B. Similarly, diode 176' within the reference leg shown in FIG. 2 has been replaced by transistor 176 and base resistor 180 within FIGS. 1A-1B. Additionally, diode 198' within the slave leg shown in FIG. 2 has been replaced by transistor 198 and base resistor 200 within FIGS. 1A-1B.

If the voltage from the emitter to the collector of transistor 246 is expressed as $V_{CE(246)}$, and if the voltage across the base-emitter junction of transistor 246 is expressed as $V_{BE(246)'}$, and if the amplification factor (i.e., ratio of collector current $I_C$ to base current $I_B$) of transistor 246 is expressed as $\beta$, and if resistor 248 is designated $R_{248}$, then $V_{CE(246)}$ may be expressed as:

$$V_{CE(246)} = V_{BE(246)} + I_B \cdot R_{248}$$

$$= V_{BE(246)} + (I_C/\beta) \cdot R_{248}$$

As temperature increases, $V_{BE(246)}$ decreases, the $\beta$ increases. Accordingly, the term $(I_C/\beta) \cdot R_{248}$ also decreases with increasing temperature. The temperature coefficient (or tracking rate) of $V_{CE(246)}$ is somewhat greater than that of $V_{BE(246)}$ due to the presence of base resistor 248. Thus, by adding base resistor 248, the effective temperature coefficient of diode 248' (see FIG. 2) is effectively increased. Similarly, the addition of base resistors 180 and 200 effectively increase the temperature coefficients of diodes 176' and 198', respectively (see FIG. 2).

By appropriately selecting values for base resistors 248, 180, and 200, the bit switch current $I_L$ conducted by resistor 50' (see FIG. 2) and the reference output leg current conducted by resistor 280' can be slightly decreased, with increasing temperatures, at a rate which compensates for the increased current gains of transistors 44' and 46' and transistors 278' and 282', respectively, whereby the currents conducted by the collector terminals of transistors 44' and 282' are maintained essentially constant over temperature. In the preferred embodiment of the invention, base resistors 248, 180 and 200 have the values 16.5K, 13.2K and 3.3K ohms, respectively.

The specific function of base resistor 248 is to compensate for temperature induced variations in base currents supplied by emitter follower transistor 240 to the base terminals of the currennt source transistors (46, 82, 92, etc.) within the bit switches. As temperature rises, current gain of the current source transistors within the bit switches increases, and accordingly, the base currents conducted thereby decrease. In order to maintain the current flowing through emitter follower transistor 240 relatively constant, the voltage across resistor 250 actually increases slightly with temperature due to the additional negative temperature coefficient component of the voltage across base resistor 248. The slight increase in voltage across resistor 250 with increasing temperatures and the resulting slight increase in currennt caused to flow therein, roughly compensates for the decrease in base currents supplied to the bit switch current source transistors. Accordingly, the current conducted by emitter follower transistor 240 is approximately constant over temperature.

The voltage across resistor 168 within the $V_{BE}$ multiplier portion of the reference leg exhibits a negative temperature coefficient component due to decreasing base current of transistor 164 at increasing temperatures. The negative temperature coefficient component of the voltage across resistor 168 due to base current variation and the negative temperature coefficient of the voltage across resistor 180 cause the voltage on voltage reference rail 178 to have a temperature coefficient that is actually greater than merely the sum of the temperature coefficients of the base-emitter junction voltages of transistors 156, 164, and 176 alone. Consequently, the voltages across the current source emitter resistors (50/52, 84, 94/96, etc.) within the bit switches and the voltage across reistor 280 actually decrease somewhat with increasing tempratures due to the decreasing base currents conducted by resistors 168 and 180. The negative temperature coefficient of the voltage across resistor 200 further serves to decrease the voltage across resistor 280 with increasing temperature. the reduced voltages across the emitter resistors of the bit switch current source transistors and across resistor 280 at higher temperatures cause the current conducted by these resistors to decrease. These reduced currents at higher temperatures approximately compensate for the higher current gains of the current source and switching transistors within each bit switch (e.g., transistors 46 and 44, respectively, in the most significant bit switch) and the higher current gains of transistors 278 and 282 in the reference output leg. Therefore, the currents conducted by the collector of transistor 44 and by the collector of transistor 282 are constant despite temperature induced variations in the current gain of such transistors.

Referring briefly to FIG. 2, the base-collector junction voltage of transistor 184' varies with changes in negative voltage supply. For example, increasing the magnitude of the negative voltage supply increases the reverse bias across the base-collector junction of transistor 184' and thereby increases the current gain and emitter efficiency of transistor 184'. Thus, the collector current of transistor 184' tends to increase as the magnitude of the negative voltage supply is increased due to the Early effect mentioned above. Similarly, as the magnitude of the negative voltage supply is increased, the reverse bias across the base-collector junction of PNP transistor 210' within the current mirror is also increased, resulting in the mirror becoming more efficient. Accordingly, an increase in the magnitude of the negative voltage supply tends to increase the current sourced by the collector terminal of transistor 210'. This increased current is conducted primarily by the reference leg and thereby effects the voltage generated on voltage reference rail 178'. This effect must be avoided if the digital-to-analog converter circuit is to have a relatively high power supply rejection ratio.

In order to avoid Early effect errors of the type described above, diode 188' within FIG. 2 is replaced by current-sharing transistors 188 and 192 (see FIGS. 1A–1B), and dtransistor 210' within FIG. 2 is replaced by transistors 210–213 (see FIGS. 1A–1B). By scaling the emitter areas of transistors 192 and 188 in the ratio of 3:1, three-fourths of the slave leg current conducted through resistor 194 is diverted to ground. In order to maintain proper current density, the emitter area of transistor 184 is equal to the emitter area of transistor 188 and is one-fourth the emitter area of transistor 198. Since the collector terminal of transistor 192 is ground referenced, an increase in the magnitude of the negative power supply voltage increases the reverse bias across the collector-base junction of transistor 192, thereby causing transistor 192 to become more efficient. The increased efficiency of transistor 192 allows it to conduct a greater share of the total current conducted by transistors 192 and 188. Accordingly, a smaller share of the slave leg current is conducted through transistors 188 and 184 to the PNP current mirror. By appropriately scaling the relative emitter areas of transistors 192 and 188, Early effect induced variations in transistor 184 and within the PNP current mirror can effectively be compensated by the Early effect induced variations associated with transistor 192. In order to compensate for the division by four of the slave leg current effected by transistors 188 and 192, transistors 210-213 multiply by a factor of four the current conducted by PNP transistor 204. Therefore, the current delivered by the current mirror network to reference leg 154 is essentially identical to the current within slave leg 182.

The increased emitter efficiencies associated with transitors 184 and 192 which result from an increase in the negative power supply voltage due to the Early effect are accompanied by a decrease in the base-emitter junction voltages associated therewith. According, the voltage dropped across resistors 194 and 202, and therefore the current conducted by the slave leg, increases slightly as the magnitude of the negative voltage supply is increased. The slight increase in current within the slave leg is mirrored into divider leg 222, resulting in a slight increase in current conducted by resistor 230. The resulting increase in voltage across resistor 230 more than offsets any decrease in the base-emitter junction voltage of transistor 234 due to Early effect induced increased emitter efficiency. The voltages at nodes 228 and 236 decrease slightly due to the increased voltage drop across resistor 230. Therefore, an increase in the magnitude of the negative power supply voltage is accompanied by a slight dcrease in the voltage upon voltage reference conductor 48; the slight decrease in the voltage of voltage reference conductor 48 approximately compensates for the increased current gain and decreased base-emitter junction voltages which occur within the current source transistors (46, 82, 92, etc.) of the bit switches due to the Early effect. Therefore, the currents within the bit switches stay relatively constant despite Early effect variations in the characteristics of the current source transistors induced by variations in the negative power supply voltage.

The open loop voltage reference circuit also includes a Gain Adjust network, designated generally by reference numeral 252, for allowing the magnitude of the bit switch currents to be adjusted somewhat without thereby adversely affecting the temperature and power supply voltage compensation characteristics of the open loop reference voltage circuit. Gain Adjust network 252 includes PNP transistor 254, the collector terminal of which is coupled to node 236 for supplying an adjustable amount of temperature independent current thereto. Those skilled in the art will appreciate that as the current supplied by transistor 254 to node 236 is varied, the voltages across resistors 230 and 232 will also change, thereby varying the voltage resulting at node 236.

The base of transistor 254 is coupled to node 256 and to the base and collector terminals of PNP transistor 258. Node 256 is coupled by conductor 260 to the collector terminal of transistor 262. Transistor 262 draws a predetermined amount of current from node 256 in a manner to be described below. The emitter of transistor 258 is coupled to the base terminal and to a first collector terminal 264 of double-collector PNP transistor 266. The second collector 268 of transistor 266 is coupled to node 270 and to the emitter of transistor 254. Node 270 is in turn coupled to Gain Adjust pad 272. The emitter of transistor 266 is coupled to node 274 and is maintained at approximately one base-emitter junction voltage above ground potential in a manner to be described below.

The collector area of first collector 264 is scaled to be five times that of second collector 268. Diode connected transistor 258 and the diode-connected first collector 264 of transistor 266 conduct the current drawn by the collector of transistor 262 and cause a current of one-fifth that magnitude to flow through second collector 268. In the preferred embodiment of the present invention, the resulting current flowing through second collector 268 is approximately 3.5 microamps. Assuming that Gain Adjust pad 272 does not conduct any current, then the 3.5 microamps of current supplied by second collector 268 is conducted by transistor 254 into node 236. On the other hand, by sourcing current to or sinking current from Gain Adjust pad 272, the current injected into node 236 by transistor 254 may be varied.

In the preferred embodiment, Gain Adjust pad 272 is coupled to a simple circuit external from the digital-to-analog converter integrated circuit, which simple circuit can source up to 1.5 microamp or sink up to 1.5 microamp. Such a circuit may be formed by coupling a potentiometer between +15 volt and −15 volt power supply voltages and coupling the tap of the potentiometer to Gain Adjust pad 272 with a 10 Meg ohm resistor. It has been found that the above described Gain Adjust network allows for 0.1 percent to 0.3 percent variation in the bit switch currents, which variation is suitable for most purposes.

The present digital-to-analog converter circuit also includes means for generating a voltage reference output signal that is substantially insensitive to variations in temperature and power supply voltage. The voltage reference output signal may conveniently be used for providing a bipolar offset to the analog output current provided by $I_{OUT}$ pad 62 in order to facilitate the conversion of the analog output current to a bipolar output voltage. In the preferred embodiment of the present invention, the voltage reference output signal is a constant +6.3 volts, although the magnitude of the voltage reference output signal may be any desired value, regardless of the nominal voltage drop across zener diode 162. The circuit elements used to create the voltage reference output signal include a 1 milliamp current source that is temperature and power supply voltage insensitive, a differential amplifier, and a laser-trimmable feedback resistor having a magnitude of approximately 6.3K ohms through which the 1 milliamp current is conducted.

With reference to FIGS. 1B and 1C, the 1 milliamp current source leg for the voltage reference output circuit is designated generally by reference numeral 276 and includes transistor 278, the base terminal of which is coupled to node 196 of slave leg 182. The emitter of transistor 278 is coupled by resistor 280 to the negative supply voltage conductor 42. Since the emitter area of transistor 278 and the magnitude of resistor 280 are identical to the emitter area of transistor 198 and the magitude of resistor 202, respectively, the current conducted by transistor 278 is identical to that within slave leg 182 and is similarly insensitive to changes in temperature or negative power supply voltage. The collector of transistor 278 is coupled to the emitter of transistor 282. The base terminal of transistor 282 is coupled to voltage reference rail 178 while its collector terminal is coupled to node 284.

Node 284 serves as an input to a differential amplifier, designated generally by reference numeral 285, including emitter coupled transistors 286 and 288. Node 284 is coupled to the base terminal of transistor 288. Diode connected transistor 289 has its emitter terminal coupled to node 284 and its base and collector terminals commonly coupled to common conductor 148. Transistor 289 serves as a clamp for preventing the voltage at node 284 from dropping significantly below ground potential. The common emitter terminals of transistors 286 and 288 are coupled to the collector of transistor 290. Transistor 290 has its base terminal coupled in common with the base terminal of transistor 262 to voltage reference rail 178 and has its emitter terminal coupled in common with the emitter terminal of transistor 262 to the collector terminal of transistor 292. The base terminal of transistor 292 is coupled to node 196 within slave leg 182, and its emitter terminal is coupled by resistor 294 to the negative voltage supply conductor 42. Thus, the temperature and voltage independent current maintained within slave leg 182 is mirrored by transistor 292 and resistor 294. The emitter areas of transistors 290 and 262 are scaled in the ratio of 3.5 to 1 for splitting the current provided by the collector of transistor 292 between emitter coupled transistors 286 and 288 of differential amplifier 285 and diode-connected transistor 258 of Gain Adjust circuit 252.

As mentioned above, node 284 serves as a first input to differential amplifier 285. The base terminal of transistor 286 serves as a second input of differential amplifier 285 and is coupled through resistor 296 to Ladder Common pad 150 to bias the second input of differential amplifier 285 at ground potential. Resistor 296 is coupled to Ladder Common pad 150 rather then Common pad 58 to avoid transient voltages imposed on Common pad 58 due to switching of the most significant bit switches within the digital-to-analog converter. The collector of transistor 286 is coupled to the base terminal of PNP transistor 298, to the base terminal of transistor 300, and to the collector terminal of PNP transistor 302. The collector terminal transistor 288 is coupled to the collector terminal of transistor 298 and to the base terminal of transistor 304. A frequency compensation network, formed by capacitor 306 and resistor 308, is coupled between the collector of transistor 288 and common conductor 148 for preventing oscillations within the differential amplifier. The base terminal of transistor 302 is coupled in common with the base and collector terminals of diode-connected PNP transistor 310 as well as to the emitter terminal of transistor 298. The emitter terminals of the transistors 302 and 310 are coupled by like valued resistors 312 and 314, respectively, to conductor 316. Resistor 318 couples conductor 316 to positive supply voltage pad 320 (+V$_{CC}$) which preferably receives a +15 volt supply voltage. An additional pad 322 (AMP V$_{SUP}$) is remotely located from +V$_{CC}$ pad 320 and is coupled thereto to facilitate the installation of a wire bond to an external amplifier circuit for conducting the positive power supply voltage thereto.

Within the output portion of the differential amplifier, the emitter of transistor 300 is coupled to the collector of transistor 304. The emitter of transistor 304 is coupled to the base terminal of output transistor 323 and is also coupled through resistor 324 to output node 326. The emitter terminal of output transistor 323 is also coupled to output node 326. The collector terminals of transistors 300 and 323 are coupled to conductor 316.

A laser-trimmable feedback resistor 328 extends between first input node 284 and output node 326. Also coupled to output node 326 is a voltage reference output pad 330 (V$_{REF\ OUT}$). PNP transistor 298 is essentially indentical to transistor 302; hence, the contribution to the current flowing through the emitter of transistor 298 owing to the base current of transistor 302 is effectively rerouted by the base of transistor 298 to the collector of transistor 286 in order to balance the loading on transistors 286 and 288. Similarly, the function of transistor 300 is to draw a base current component from the collector of transistor 302 equal to the base current component drawn by transistor 304 from the collector of transistor 298 to further balance the loading on transistors 286 and 288. Accordingly, the loading on the collectors of transistors 286 and 288 is substantially matched to minimize any offset associated with differential amplifier 285.

The differential amplifier includes a short circuit protection network formed by transistors 332, 334, and 336. The emitter of PNP transistor 332 is coupled to positive voltage supply pad 320 and its base terminal is coupled to conductor 316. The collector terminal of transistor 332 is coupled to the base and collector terminals of diode-connected transistor 334, the emitter of which is coupled to common conductor 148. The emitter and base terminals of transistor 336 are coupled in common with those of transistor 334, while its collector terminal is coupled to the collector of transistor 288. In the event that the collector of output transistor 322 draws an abnormally large amount of current, the voltage drop across resistor 318 is sufficient to forward bias transistor 332. The current conducted by transistor 332 is conducted by transistor 334 and is mirrored by transistor 336. The resulting collector current of transistor 336 effectively deprives transistor 304 of any drive current, thereby shutting off output transistor 323 during such a short circuit condition.

As mentioned above, the reference current drawn by transistor 282 is approximately 1milliamp in magnitude and is substantially temperature and power supply voltage independent. Any small changes in this 1 milliamp current which might occur due to variations in processing, temperature, power supply voltage, etc., track with any similar small changes in the analog output current summed at I$_{OUT}$ pad 62. Feedback resistor 328 is laser-trimmed during fabrication in order to provide a positive 6.3 volt output reference voltage on pad 330. The output reference voltage is similarly temperature and power supply voltage insensitive.

In addition to being useful for implementing a bipolar offset voltage conversion scheme in a manner to be described below, the +6.3 volt reference output voltage is also utilized within the digital-to-analog converter circuit for generating the voltage on sub-regulated voltage supply rail 24, the voltage on sub-regulated bias conductor 38, and the voltage on threshold voltage conductor 54. Output node 326 is coupled to one end of resistor 338, the opposite end of which is coupled at node 339 to one end of resistor 340 and to the base terminal of transistor 342. The end of resistor 340 opposite node 339 is coupled at node 343 to one end of resistor 344 and to the base terminal of transistor 346. The end of resistor 344 opposite node 343 is coupled to the base and collector terminals of diode-connected transistor 348. The emitter of transistor 348 is coupled to the base and collector terminals of diode-connected transistor 350. The emitter of transistor 350 is coupled to node 274 and to the emitter terminal of PNP transistor 352. The base terminal of transistor 352 is coupled by conductor 354 to Ladder Common pad 150. Accordingly, node 274 is maintained at one base-emitter junction voltage above ground potential.

The collector of transistor 352 is coupled to the base and collector terminals of transistor 354. The emitter terminal of transistor 354 is coupled by resistor 356 to negative voltage supply conductor 42. The current conducted by the collector of transistor 352 is also conducted by transistor 354 and resistor 356 for biasing a voltage upon subregulated bias conductor 38.

Referring again to the resistive divider network, the emitter of transistor 342 is coupled to the base terminal of transistor 358. The collector terminals of transistors 342, 346 and 358 are each connected to a positive supply voltage pad 360 ($V_{LOGIC}$) which typically receives a power supply voltage of +5 volts. Whereas positive supply voltage pad 320 supplies a positive voltage to the differential amplifier circuitry used to generate the reference output voltage, $V_{LOGIC}$ pad 360 supplies current used within the input networks of each of the twelve bit switch circuits. Coupled between the base and emitter of transistor 358 is a relatively high valued pinch resistor 362 for maintaining a bias current within transistor 342. As is known to those skilled in the art, pinch resistor 362 may be fabricated by first diffusing an elongated P-type base region within an isolated epitaxial region of the integrated circuit and thereafter diffusing an N-type emitter diffusion across the central portion of the elongated base diffusion.

The emitter of transistor 358 is coupled to subregulated voltage supply rail 24 for supplying thereto a voltage of approximately +2.5 volts. The current flowing through the resistive divider network formed by resistors 338, 340 and 344 is equal to the +6.3 volt reference output voltage less the three base-emitter junction voltages of transistors 348, 350 and 353, divided by the sum of the magnitudes of resistors 338, 340 and 344. The temperature coefficients of the base-emitter junction voltages of transistors 342 and 358 are partially offset by the temperature coefficient of the voltage developed at node 339 by the resistive divider network whereby the voltage on subregulated voltage supply rail 24 moves more positive with increasing temperature at the rate of approximately 0.8 millivolt per degree Centigrade. Assuming that most significant bit input pad 2 is at a high level or logic "1," then the voltage developed at the base of transistor 30 is primarily determined by the voltage of subregulated voltage supply rail 24. The positive tracking coefficient of subregulated voltage supply rail 24 helps to increase the magnitude of the voltage differential between the base terminals of the emitter coupled bit switch transistors 30 and 44. Larger voltage differentials are required at higher temperatures to prevent the emitter-coupled bit switch transistors from sharing the bit switch current.

The emitter of transistor 346 is coupled to a first emitter 366 of a double emitter transistor 368. The base terminal of transistors 368 is coupled to the collector of transistor 370, the base terminal of which is coupled to subregulated bias conductor 38. The emitter of transistor 370 is coupled through resistor 372 to negative supply voltage conductor 42. As in the case of emitter 28 of transistor 30 within the most significant bit switch, emitter 366 of transistor 368 is operated in zener breakdown mode for level shifting the voltage produced at the emitter of transistor 346. Transistor 370 maintains a bias current within the resulting zener diode. The collector terminal of transistor 368 is coupled to waste conductor 56. Second emitter terminal 374 of transistor 368 is coupled to threshold voltage conductor 54 and to the collector of transistor 376. The base terminal of transistor 376 is coupled to subregulated bias voltage conductor 38, and its emitter is coupled by resistor 378 to negative supply voltage conductor 42. Transistor 376 maintains a bias current flowing within emitter 374 of transistor 368.

Resistors 338, 340 and 344 within the resistive divider are selected such that the voltage produced on threshold voltage conductor 54 is essentially eequal to +1.4 volts less the voltage drop associated with the zener diode formed by emitter 366 of transistor 368. Moreover, the temperature coefficient of the voltage at the base of transistor 346 effectively cancels the variation in base-emitter junction voltages across transistors 346 and emitter 374 of transistor 368, whereby the temperature coefficient of the voltage provided to threshold voltage conductor 54 is essentially equal to the temperature coefficient of the zener diode formed by emitter 366 of transistor 368. Accordingly, if input terminal 2, corresponding to the most significant bit, is held at a constant +1.4 volts, then the voltages at the base terminals at transistors 30 and 44 will remain approximately equal to one another despite variations in temperature since variations in the voltage across the zener diode formed by emitter 28 of transistor 30 are matched by variations in the zener diode formed by emitter 366 of transistor 368. In the preferred embodiment of the present invention, resistors 338, 340, 344 and 356 have the values 9.60K, 4.67K, 3.90K and 857 ohms, respectively.

A plurality of resistors and capacitors are also fabricated within the integrated circuit to facilitate bipolar offset of the analog output current provided by the digital-to-analog converter and to facilitate conversion of such analog output current to an output voltage. Resistor 380 is a laser-trimmable resistor extending between pads 382 and 384 and having a nominal magnitude of 6.3K ohms. Capacitor 386 extends between $I_{OUT}$ pad 62 and pad 388. Laser-trimmable resistor 390 extends between pad 388 and pad 392 and has a nominal value of 2K ohms. Laser-trimmable resistor 394 extends between pad 392 and pad 396 and has a nominal value of 3K ohms. Laser-trimmable resistors 398 and 400 each extend between pad 396 and $I_{OUT}$ pad 62 and each has a nominal value of 10K ohms. In addition, capacitor 402 also extends between pad 396 and $I_{OUT}$ pad 62.

The manner in which the bipolar offset current and the analog output voltage are developed will now be described with reference to FIG. 3. Differential amplifier 285 is shown symbolically within FIG. 3 and, as described above, includes a first input coupled to node 284 and a second input coupled to ground potential via Ladder Common pad 150. Node 284 is coupled to the reference output leg 276 of the open loop voltage reference circuit for conducting reference current $I_1'$ having a magnitude of approximately 1 milliamp. The output of differential amplifier 285 is coupled to output node 326, and 6.3K ohm feedback resistor 328 ($R_F$) is coupled between nodes 284 and 326. A constant voltage of +6.3 volts is established on output node 326 which is in turn coupled to voltage reference output pad 330.

One end of 6.3K ohm resistor 380 ($R_{BPO}$) is coupled to the +6.3 V reference output voltage pad 330, and the opposite end of resistor 380 is coupled to node 404. Node 404 symbolizes a common coupling, whether made internal or external to the digital-to-analog converter integrated circuit package, between resistor 380 and $I_{OUT}$ pad 62. Node 404 is also coupled to a first input of an operational amplifier 406 external from the digital-to-analog converter integrated circuit. Second input 408 of operational amplifier 406 is coupled to ground potential, as by wire bonding the same to AMP+IN pad 152 (see FIG. 1B). The output of operational amplifier 406 is coupled to node 410 and to voltage output terminal 412. Output resistance 414 ($R_{OUT}$) is coupled between output node 410 and input node 404. Resistor 414 may comprise the 5K ohm resistance extending between pad 396 and $I_{OUT}$ pad 62, in which case pad 396 is coupled to node 410. Alternatively, resistor 414 may comprise resistors 398 and 400 in series with resistors 390 and 394, in which case pad 388 is coupled to node 410. Similarly, other combinations of resistors 390, 394, 398 and 400 may be utilized as the output resistor 414 through appropriate interconnection of pads 388, 392 and 396 to $I_{OUT}$ pad 62 and node 410. By fabricating resistors 380, 390, 394, 398 and 400 within the digital-to-analog converter integrated circuit, such resistances are laser-trimmable and have temperature coefficients which match those resistors within the integrated circuit which determine both the $V_{REF\ OUT}$ reference output voltage and the analog output current. Capacitors 386 and 402 aid in reducing the settling time of external operational amplifier 406. By varying the magnitude of $R_{OUT}$ resistor 414, the magnitude of the full scale analog voltage produced at $V_{OUT}$ terminal 412 may be varied accordingly.

Still referring to FIG. 3, operational amplifier 406 maintains node 404 at virtual ground potential. Accordingly, $R_{BPO}$ resistor 380 has 6.3 volts thereacross and conducts 1 milliamp of current to node 404. In the preferred embodiment of the present invention, the full scale analog output current is 2 milliamp, of which 1 milliamp is contributed by the most significant bit switch. The current conducted through $R_{OUT}$ is resistor 414 is equal to the analog output current $I_{OUT}$ less the bipolar offset current conducted by $R_{BPO}$ resistor 380. Therefore, assuming the value of $R_{OUT}$ resistor 414 to be 5K ohms, the voltage at $V_{OUT}$ terminal 412 will range between $-5.0$ volts and $+5.0$ volts depending upon the status of the bits within the input digital word.

FIG. 4 illustrates an alternate embodiment of an open loop voltage reference circuit suitable for use within the digital-to-analog converter circuit previously described with reference to FIGS. 1A–1C. Those components within FIG. 4 which correspond to components previously described with reference to FIGS. 1A–1C and FIG. 2 are referenced by corresponding double-primed reference numerals. Within FIG. 4, transistors 46" and 62" correspond to the current source transistor and one of the switching transistors within the most significant bit switch. The collector of transistor 62" contributes current $I_O$ to the total analog output current. Transistors 278" and 282" correspond to the previously described reference output leg; however, the base of transistor 278" is coupled to voltage reference conductor 48" rather than being coupled to the slave leg as it is in the circuit shown in FIG. 2. To further ensure that currents $I_{REF}$ and $I_O$ track with one another, the base terminal of transistor 282' may be biased by the threshold voltage conductor 54".

As before, the open loop reference circuit includes a reference leg including a $V_{BE}$ multiplier (transistor 164" and resistors 166" and 168") and a zener diode 162". However, the first and second terminals contacting the P-type base diffusion of zener diode 162" are not coupled in common as is true for the zener diode 162 shown in FIG. 1B; instead, one of such terminals is coupled to the collector of transistor 404, and the other terminal is coupled to the base of transistor 406. The emitter of transistor 406 is coupled to the base of transistor 404 and to the collector of transistor 408. The emitter terminals of transistors 404 and 408 are each coupled to negative voltage supply terminal 43".

As before, the voltage of reference rail 178" is equal to a compensated component $V_{COMP}$ + three base-emitter junction voltages. $V_{COMP}$ is the sum of the voltages across zener diode 162" and resistor 168". The three base-emitter junction voltages added to $V_{COMP}$ are those across the base-emitter junctions of transistors 164", 406, and 404. The bulk of the zener diode current is conducted by the collector of transistor 404 while only a small biasing current is conducted by the base of transistor 406. Thus, any component of the voltage across zener diode 162" due to voltage drops across resistances associated with the contact of zener diode 162" that conducts the bulk of the zener diode current do not affect the voltage sensed at the base terminal of transistor 406. Those skilled in the art will recognize this manner of interconnection to zener diode 162" as a Kelvin-sensed approach. The collector of transistor 408 supplies a substantially constant biasing current to transistor 406, which current is conducted by the collector of transistor 406 and split by scaled transistors 262" and 290" in a manner previously described.

The open loop voltage reference circuit illustrated by FIG. 4 also includes a slave leg including transistors 184" and 192", diodes 188" and 198", and resistors 194" and 202". The relative positions of diode 198" and resistor 202" are reversed from that shown within FIG. 2 in order to form a current mirror interconnection between diode 198" and transistor 408.

Transistor 192" is again utilized to compensate for Early effect induced variations in the current conducted by the collector of transistor 184" and the current conducted by the PNP current mirror. The emitter area of transistor 192" is equal to the emitter area of diode 188" so that approximately one-half of the slave leg current is passed through transistor 184" to the PNP current mirror, designated within FIG. 4 by 204"–210". The PNP current mirror is scaled to source an output current having a magnitude twice that of the slave leg current. The current sourced by the PNP mirror is conducted by diode 410 to the zener diode reference leg. The anode of diode 410 is coupled to the base of transistor 412 for biasing the same at one base-emitter junction voltage above voltage reference rail 178". The emitter of transistor 412 is coupled to the collectors of transistors 234" and 240" for preventing base-collector junction voltage variation on such transistors due to changes in the negative power supply voltage.

As in the case of the previously described open loop voltage reference circuit, the circuit shown in FIG. 4 includes a divider leg including transistors 224" and 234" and resistors 226" and 230". Similarly, the circuit shown in FIG. 4 includes an emitter follower output leg including transistors 240" and 246" and resistors 248" and 250". Current within the divider leg is set by coupling the base terminal of transistor 224" through resistor 414 to node 196" within the slave leg. The values for resistors 248" and 414 are selected to cancel variations in currents $I_{REF}$ and $I_O$ which would otherwise appear due to temperature-induced variations in the current gains of transistors 278" and 282" and transistors 46" and 62", respectively.

Thus, the primary differences between the open loop voltage reference circuit shown in FIG. 4 and that shown in FIGS. 1A–1C and FIG. 2 are that the zener diode voltage is Kelvin-sensed and that the $I_{REF}$ current leg is driven by the same voltage reference conductor (48″) used to drive the current sources within the bit switches. While not isolating the $I_{REF}$ current from transients on voltage reference conductor 48″ as well as the previously described open loop reference circuit, the circuit of FIG. 4 provides excellent matching between the bipolar offset current (generated via $I_{REF}$) and the analog output current conducted by the $I_{OUT}$ pad of the digital-to-analog converter circuit.

While the invention has been described with reference to a preferred embodiment thereof, the description is for illustrative purposes only and is not to be construed as limiting the scope of the invention. Various modifications and changes may be made by those skilled in the art without departing from the true spirit and scope of the invention as defined by the appended claims.

We claim:

1. A digital-to-analog converter circuit having a plurality of bit switch current sources responsive to a bias voltage for generating a plurality of bit switch currents, said digital-to-analog converter circuit including an open-loop voltage reference circuit for regulating the bias voltage, said open-loop voltage reference circuit comprising in combination:
   a. first and second power supply voltage conductors for conducting first and second power supply voltages, respectively;
   b. a reference voltage conductor for conducting a reference voltage;
   c. a first current leg coupled between said reference voltage conductor and said first power supply voltage conductor for conducting a first current and generating a reference voltage on said reference voltage conductor in response thereto, said first current leg including a zener diode junction;
   d. a second current leg coupled between said reference voltage conductor and said first power supply voltage conductor, said second current leg including a biasing transistor having first, second, and third terminals, said first terminal being coupled to said first power supply voltage conductor and said second terminal being coupled to said reference voltage conductor, said biasing transistor being biased by the reference voltage for conducting a second current in response thereto;
   e. current mirror means coupled to said second power supply voltage conductor, said current mirror means being coupled to said reference voltage conductor for providing the first current thereto, said current mirror means also being coupled to the third terminal of said biasing transistor and being responsive to the magnitude of the second current for maintaining the magnitude of the first current in a predetermined relationship therewith; and
   f. circuit means coupled to said reference voltage conductor for receiving the reference voltage and for providing the bias voltage in response thereto, said circuit means maintaining the bias voltage in a predetermined relationship with the reference voltage for maintaining said plurality of bit switch currents substantially constant, said circuit means including an emitter follower drive leg for providing a low impedance source of the bias voltage and for isolating said reference voltage conductor from transients imposed upon the bias voltage due to switching of the plurality of bit switch currents, said emitter follower drive leg including an emitter follower transistor having base and emitter terminals, the base terminal of said emitter follower transistor being coupled to said reference voltage conductor and the emitter terminal of said emitter follower transistor providing said bias voltage.

2. A digital-to-analog converter circuit as recited by claim 1 wherein said biasing transistor has emitter and base terminals corresponding to said first and second terminals, respectively.

3. A digital-to-analog converter circuit as recited by claim 1 wherein said zener diode junction has a voltage characterized by a positive temperature tracking coefficient and wherein said first current leg includes at least one forward biased P-N semiconductor junction coupled in series with said zener diode junction for offsetting the positive temperature tracking coefficient of said zener diode junction voltage.

4. A digital-to-analog converter circuit as recited by claim 1 wherein said zener diode junction has a voltage characterized by a positive temperature tracking coefficient and wherein said first current leg includes a negative temperature coefficient voltage means coupled in series with said zener diode junction for providing a compensating voltage having a negative temperature tracking coefficient of a magnitude equal to that of the temperature tracking coefficient of said zener diode junction voltage, the sum of said zener diode junction voltage and said compensating voltage being a temperature compensated voltage component of the reference voltage.

5. A digital-to-analog converter circuit as recited by claim 4 wherein said negative temperature coefficient voltage means includes first and second series-coupled resistors and a forward biased P-N semiconductor junction coupled across said first series-coupled resistor for maintaining the voltage across said second series-coupled resistor proportional to the voltage of said forward biased P-N semiconductor junction according to the ratio of the magnitudes of said second series-coupled resistor to said first series-coupled resistor.

6. A digital-to-analog converter circuit as recited by claim 4 wherein said first current leg includes M forward-biased P-N semiconductor junctions coupled in series with said zener diode junction and with said negative temperature coefficient voltage means, wherein M is an integer greater than or equal to one, and wherein said second current leg includes a resistor coupled in series with M forward-biased P-N semiconductor junctions, said M semiconductor junctions within said second current leg having voltages substantially equal to the voltages across said M semiconductor junctions within said first current leg for causing the voltage across said resistor within said second current leg to be substantially equal to the temperature compensated voltage component of the reference voltage in order to maintain the second current substantially independent of temperature.

7. A digital-to-analog converter circuit as recited by claim 5 wherein said first and second series-coupled resistors are fabricated by thin film deposition to allow said first and second series-coupled resistors to be laser-trimmed for adjusting the negative temperature coefficient of the voltage across said second series-coupled resistor to be equal and opposite to the temperature coefficient of said zener diode junction voltage.

8. A digital-to-analog converter circuit as recited by claim 6 wherein the base-emitter junction of said biasing transistor is one of said M semiconductor junctions within said second current leg.

9. A digital-to-analog converter circuit as recited by claim 6 wherein each of said plurality of bit switch current sources includes a current source transistor having emitter and base terminals, the base terminal of each current source transistor receiving the bias voltage and the emitter terminal of each current source transistor being coupled through a resistor to said first power supply voltage conductor, wherein one of said M forward-biased PN semiconductor junctions within each of said first and second current legs has a voltage thereacross which matches the voltage across the base-emitter junction of each of said current source transistors.

10. A digital-to-analog converter circuit as recited by claim 8 wherein said biasing transistor includes collector terminal corresponding to said third terminal of said biasing transistor.

11. A digital-to-analog converter circuit as recited by claim 10 wherein said current mirror means includes a first PNP transistor means having emitter, base and collector terminals, the emitter terminal of said first PNP transistor means being coupled to said second power supply voltage conductor, and the base and collector terminals of said first PNP transistor means being coupled to the collector terminal of said biasing transistor within said second current leg, said current mirror means further including a second PNP transistor means having emitter, base and collector terminals, the emitter terminal of said second PNP transistor means being coupled to said second power supply voltage conductor, the base terminal of said second PNP transistor means being coupled to the base terminal of said first PNP transistor means, and the collector terminal of said second PNP transistor means being coupled to said voltage reference conductor for supplying the first current thereto.

12. A digital-to-analog converter circuit as recited by claim 11 wherein:
   a. variations in voltage across said first and second power supply voltage conductors causes a variation in the base-collector voltage across said biasing transistor within said second current leg and across said second PNP transistor means, in turn varying the current gain characteristics thereof; and
   b. one of said M semiconductor junctions within said second current leg includes first and second current sharing transistors each having emitter, base, and collector terminals, the emitter terminals of said first and second current sharing transistors being coupled in common, the base terminals of said first and second current sharing transistors being coupled in common and each being coupled to the collector terminal of said first current sharing transistor, said common emitter terminals and common base terminals of said first and second current sharing transistors being coupled in series within said second current leg, and the collector terminal of said second current sharing transistor being coupled to said second power supply voltage conductor, wherein variations in voltage across said first and second power supply voltage conductors causes a variation in current gain characteristics of said second current sharing transistor tending to offset variations in current gain characteristics of said biasing transistor and said second PNP transistor means.

13. A digital-to-analog converter circuit as recited by claim 9 wherein said emitter follower drive leg further includes bias current means coupled between the emitter of said emitter follower transistor and said first power supply voltage conductor for providing a bias current to said emitter follower transistor.

14. A digital-to-analog converter circuit as recited by claim 9 wherein:
   a. said emitter follower drive leg includes a base resistor coupled between the base terminal of said emitter follower transistor and said reference voltage conductor; and
   b. said open-loop voltage reference circuit further includes gain adjust means for adjusting the magnitude of said plurality of bit switch currents without adversely affecting the temperature compensated nature thereof, said gain adjust means supplying a temperature independent offset current of an adjustable magnitude to the base terminal of said emitter follower transistor for adjustably varying the voltage drop across said base resistor and causing a corresponding variation in the bias voltage.

15. A digital-to-analog converter circuit as recited by claim 9 wherein:
   a. each current source transistor includes a collector terminal;
   b. said digital-to-analog converter includes at least one bit switch transistor associated with each current source transistor, each bit switch transistor having an emitter terminal coupled to the collector terminal of its associated current source transistor and having a collector terminal;
   c. each current source transistor and associated bit switch transistor having a current gain tending to increase with higher temperatures, the emitter-base junction voltage of each current source transistor decreasing at higher temperatures; and
   d. said open-loop voltage reference circuit causing said bias voltage to decrease at higher temperatures at a rate slightly in excess of the rate at which the emitter-base junction voltage of each current source transistor decreases for decreasing the current conducted by the emitter of each current source transistor at a rate which approximately compensates the increased current gains of each current source transistor and associated bit switch transistor in order to maintain the current conducted by the collector terminal of each bit switch transistor substantially constant over temperature.

16. A digital-to-analog converter circuit as recited by claim 14 wherein said gain adjust means comprises in combination:
   a. gain adjust current source means coupled to said second current leg and biased thereby for providing a first gain adjust current substantially independent of temperature;
   b. gain adjust current mirror means coupled to said second power supply voltage conductor, said gain adjust current mirror means also being coupled to said gain adjust current source means and responsive to the first gain adjust current for providing a second gain adjust current proportional thereto; said gain adjust current mirror means providing the second gain adjust current to an output node thereof;
   c. a gain adjust terminal coupled to the output node of said gain adjust current mirror means for allowing current to be added thereto or subtracted therefrom externally from the digitial-to-analog converter circuit; and d. gain adjust transistor means coupled between the output node of said gain adjust current mirror means and the base terminal of said emitter follower transistor for conducting the second gain adjust current, augmented by the current added thereto or subtracted therefrom by said gain adjust terminal, to the base terminal of said emitter follower transistor.

17. A digital-to-analog converter circuit as recited by claim 16 wherein said gain adjust current mirror means and said gain adjust transistor means bias said gain adjust terminal at the voltage of said second power supply voltage conductor.

18. A digital-to-analog converter circuit as recited by claim 13 wherein one of said M forward-biased PN semiconductor junctions within each of said first and second current legs has a voltage thereacross which matches the voltage across the base-emitter junction of said emitter follower transistor.

19. A digital-to-analog converter circuit as recited by claim 13 wherein said bias current means comprises:
 a. a bias current transistor having emitter, base, and collector terminals, the base and collector terminals being coupled to the emitter terminal of said emitter follower transistor; and
 b. a resistor coupled between the emitter terminal of said bias current transistor and said first power supply voltage conductor.

20. A digital-to-analog converter circuit as recited by claim 19 wherein:
 a. said current source transistor of each of said plurality of bit switch current sources and said bias current transistor each have a current amplification factor associated therewith equal to the ratio of its collector current relative to its base current, the current amplification factor increasing at higher temperatures; and
 b. said bias current means further including a base resistor coupled between the base and collector terminals of said bias current transistor, the base current of said bias current transistor decreasing at higher temperatures, which base current causes a voltage drop across said base resistor, which voltage drop also decreases at higher temperatures, the decreasing voltage drop across said base resistor tending to increase the bias current provided by said bias current means at higher temperatures at a rate which approximately compensates for the decrease in the sum of the base currents conducted by each of said current source transistors at higher temperatures.

21. A digital-to-analog converter circuit as recited by claim 18 wherein said circuit means further includes a divider leg for coupling said emitter follower drive leg to said reference voltage conductor and for reducing the magnitude of the temperature compensated voltage component included within the bias voltage, said divider leg including:
 a. a divider leg follower transistor having base and emitter terminals, the base terminal of said divider leg follower transistor being coupled to said voltage reference conductor for receiving said reference voltage;
 b. a divider leg current source coupled to said second current leg and biased thereby for conducting a current mirrored to the second current, said divider leg current source having an output node for supplying said mirrored current;
 c. a voltage dropping resistor coupled between the emitter terminal of said divider leg follower transistor and the output node of said divider leg current source for dropping a substantially constant voltage thereacross; and
 d. said output node being coupled to the base terminal of said emitter follower transistor for providing a voltage thereto having as a component thereof a temperature compensated voltage of a magnitude smaller than that of the temperature compensated voltage component of the reference voltage.

22. A digital-to-analog converter circuit as recited by claim 21 wherein one of said M forward-biased PN semiconductor junctions within each of said first and second current legs has a voltage thereacross which matches the voltage across the emitter-base junction of said divider leg follower transistor.

23. A digital-to-analog converter circuit as recited by claim 21 wherein M is equal to 3, the three forward-biased P-N semiconductor junctions within each of said first and second current legs being matched by the base-emitter junctions of said divider leg follower transistor, said emitter follower transistor, and each current source transistor within said plurality of bit switch current sources, respectively, for causing a voltage to appear across each resistor within each of said plurality of bit switch current sources which voltage is substantially proportional to the temperature compensated voltage component of the reference voltage.

24. A digital-to-analog converter circuit as recited by claim 15 wherein:
 a. the characteristics of said current source transistor included with each of said plurality of bit switch current sources exhibit Early Effect variations as the voltage between said first and second power supply voltage conductors is varied; and
 b. the mirrored current supplied by said divider leg current source varies as the voltage between said first and second power supply voltage conductors is varied for varying the voltage across said voltage dropping resistor and thereby varying said bias voltage by a magnitude and in a direction to essentially compensate for Early Effect variations in the characteristics of said current source transistor included with each of said plurality of bit switch current sources.

25. A digital-to-analog converter circuit as recited by claim 24 wherein said second current leg includes at least one transistor having an emitter, a base, and a collector, wherein the collector of said at least one transistor is coupled to a voltage referenced to said second power supply voltage for varying the current in said second current leg as the voltage between said first and second power supply voltage conductors is varied.

* * * * *